(12) United States Patent
Saidaminov et al.

(10) Patent No.: US 12,165,815 B2
(45) Date of Patent: Dec. 10, 2024

(54) DOPED METAL HALIDE PEROVSKITES WITH IMPROVED STABILITY AND SOLAR CELLS COMPRISING SAME

(71) Applicant: THE GOVERNING COUNCIL OF THE UNIVERSITY OF TORONTO, Toronto (CA)

(72) Inventors: Makhsud Saidaminov, Victoria (CA); Junghwan Kim, Busan (KR); Ankit Jain, Bombay (IN); Oleksandr Voznyy, North York (CA); Edward H. Sargent, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 16/972,070

(22) PCT Filed: Jun. 7, 2019

(86) PCT No.: PCT/CA2019/050804
§ 371 (c)(1),
(2) Date: Dec. 4, 2020

(87) PCT Pub. No.: WO2019/232643
PCT Pub. Date: Dec. 12, 2019

(65) Prior Publication Data
US 2021/0125790 A1    Apr. 29, 2021

Related U.S. Application Data

(60) Provisional application No. 62/681,917, filed on Jun. 7, 2018.

(51) Int. Cl.
H01G 9/20    (2006.01)
C07F 7/24    (2006.01)
(Continued)

(52) U.S. Cl.
CPC ............. *H01G 9/2009* (2013.01); *C07F 7/24* (2013.01); *H10K 30/10* (2023.02); *H10K 85/30* (2023.02)

(58) Field of Classification Search
CPC ........ H01L 51/0077; H01L 51/42–448; H01G 9/2009; C07F 7/24; H10K 30/10; H10K 85/30
See application file for complete search history.

(56) References Cited

U.S. PATENT DOCUMENTS

2018/0005762 A1    1/2018    Zhu et al.

FOREIGN PATENT DOCUMENTS

WO    2014045021 A1    3/2014
WO    2016109902 A2    7/2016
(Continued)

OTHER PUBLICATIONS

Shai et al, Achieving ordered and stable binary metal perovskite via strain engineering, Nano Energy vol. 48, Mar. 2018, pp. 117-127. (Year: 2018).*

(Continued)

*Primary Examiner* — Andrew J Golden
(74) *Attorney, Agent, or Firm* — HILL & SCHUMACHER

(57) ABSTRACT

Perovskites have high density of vacancies which absorb oxygen molecules and upon illumination, transform them into superoxide species which react with perovskites to decompose them, preventing use of these materials in many photo-applications. The present disclosure provides ways for improving the stability of perovskites in air ambient by doping perovskites with metals such as lead, cadmium, zinc, manganese, iron, cobalt, nickel, copper and tin which decreases the density of vacancies in perovskites and significantly increases the lifetime of perovskites. Perovskite (Continued)

solar cells containing inorganic and organic ions such as Cs+, formamidinium and methylammonium cations, $Pb^{2+}$, Br— and I— with these metal dopants exhibit stable efficiency within a month of storage in air ambient with the relative humidity of 50%.

23 Claims, 32 Drawing Sheets

(51) Int. Cl.
*H10K 30/10* (2023.01)
*H10K 85/30* (2023.01)

(56) References Cited

FOREIGN PATENT DOCUMENTS

| | | | | |
|---|---|---|---|---|
| WO | 2016115602 | A1 | 7/2016 | |
| WO | WO-2017089819 | A1 * | 6/2017 | ......... H01L 51/4226 |
| WO | 2017128987 | A1 | 8/2017 | |

OTHER PUBLICATIONS

Eperon et al, Perovskite-perovskite tandem photovoltaics with optimized band gaps, Science 354.6314 (2016): 861-865. (Year: 2016).*

Navas et al, New insights on the organic-inorganic hybrid perovskite CH3NH3Pbl3 nanoparticles. Experimental and theoretical study of doping in Pb2+ sites with Sn2+, Sr2+, Cd2+ and Ca2+, Nanoscale, 2015,7, 6216-6229. (Year: 2015).*

Saliba et al, Cesium-containing triple cation perovskite solar cells: improved stability, reproducibility and high efficiency, Energy Environ. Sci., 2016, 9, 1989. (Year: 2016).*

Tong et al, Cadmium-doped flexible perovskite solar cells with a low-cost and low-temperature-processed CdS electron transport layer, RSC Adv., 2017, 7, 19457 (Year: 2017).*

Navas et al, Revealing the role of Pb2+ in the stability of organic-inorganic hybrid perovskite CH3NH3Pb1-xCdxI3: an experimental and theoretical study, Phys. Chem. Chem. Phys., 2015, 17, 23886-23896. (Year: 2015).*

Jeon, N. J. et al., "Compositional engineering of perovskite materials for high-performance solar cells", Nature 517, 476-480 (2015).

Dunlap-Shohl, W. A., Younts, R., Gautam, B., Gundogdu, K. & Mitzi, D. B., "Effects of Cd Diffusion and Doping in High-Performance Perovskite Solar Cells Using CdS as Electron Transport Layer", J. Phys. Chem. C 120, 16437-16445 (2016).

Saidaminov, et al., "Suppression of atomic vacancies via incorporation of isovalent small ions to increase the stability of halide perovskite solar cells in ambient air", Nature Energy, vol. 3, 2018, p. 648-654.

Jain, et al., "High-Throughput Screening of Lead-Free Perovskite-like Materials for Optoelectronic Applications", The Journal of Physical Chemistry C, vol. 121, Mar. 16, 2017 p. 7183-7187.

Boyd, et al., "Understanding Degradation Mechanisms and Improving Stability of Perovskite Photovoltaics", Chemical Reviews, vol. 119, 2019, epub. Nov. 16, 2018 p. 3418-3451.

International search report from the parent PCT/CA2019/050804 dated Oct. 9, 2019.

\* cited by examiner

DOPED METAL HALIDE PEROVSKITES WITH IMPROVED STABILITY AND SOLAR CELLS COMPRISING SAME

FIELD

The present disclosure relates to organic-inorganic halide perovskite materials with applications in photovoltaics and in particular it relates to doping of on the metal cation site of halide perovskites for improved stability. Embodiments include doping on the Pb cation site of lead halide perovskites. Example improvements in stability include improved air stability.

BACKGROUND OF THE INVENTION

The power conversion efficiency (PCE) of $MAPbI_3$-based solar cells ($MA=CH_3NH_3^+$) has improved rapidly in the last five years. However, instability in $MAPbI_3$ limits this active material's applicability in solar cell (PSC) technology. Notable progress toward increasing the stability of PSCs was recently made via the engineering of interfaces and of carrier selective layers. Developing even more stable perovskite active layers is now a topic that requires further effort. The incorporation of low-dimensional structures is an attractive approach to improve the stability of perovskites, but, at present, compromises PCE.

Replacing MA with FA ($HC(NH_2)_2^+$) has been found to produce perovskites relatively stable against decomposition at high temperatures[1]; however, at room temperature, $FAPbI_3$ is structurally unstable owing to the large size of the FA cation: it spontaneously transforms into a yellow, non-functional phase. The structural instability of $FAPbI_3$ was recently addressed by engineering the Goldschmidt tolerance factor in perovskites via the partial substitution of FA with MA and/or Cs, and of I with $Br^{2-4}$. Cation/anion-mixed perovskite solar cells were shown to operate stably at maximum power point (MPP) conditions under continuous illumination and nitrogen flow for hundreds of hours[5].

The structural stability of mixed perovskites can be understood in terms of steric effects and energy gain from entropy of mixing[6,7], nevertheless, the mechanisms that prevent the decomposition of these perovskites remain incompletely understood. Understanding the factors governing stability against decomposition will enable fabrication of PSCs that are more tolerant to air ambient. The need for air-tolerant solar cells arises from the high water vapor and oxygen transmission rates (WVTR and OTR, respectively) of cost-effective photovoltaic encapsulation materials, which until now have been insufficient for protection of PSCs; in contrast, the best alternative atmospheric barriers work well with perovskites, but add cost (Table 1). Developing air-ambient-tolerant perovskite active layers will ensure that practical encapsulation technologies can be applied.

SUMMARY

The inventors found that perovskites have high density of vacancies. These vacancies absorb oxygen molecules and upon illumination, transform them into superoxide species. The latter reacts with perovskites to decompose them.

The inventors then developed ways for improving the stability of perovskites in air ambient. The inventors doped perovskites with metals (including Cd, Zn, Hg, Ba, Ca, Sr), and found that this doping decreases the density of vacancies in perovskites and significantly increases the lifetime of perovskites.

The inventors have demonstrated perovskite solar cells containing inorganic and organic ions (such as Cs+, formamidinium and methylammonium cations, $Pb^{2+}$, $Br^-$ and $I^-$) with mentioned dopants exhibit stable efficiency within a month of storage in air ambient with the relative humidity of 50%. In contrast, state-of-art perovskite solar cells exhibit almost twofold decrease in efficiency when tested in analogues conditions.

Thus in one aspect the present disclosure provides a perovskite compound having a formula $ABX_3$, wherein A comprises formamidinium (FA), cesium (Cs) and methylammonium (MA); wherein B comprises a mixture of lead (Pb) and cadmium (Cd); and wherein X comprises bromide (Br) and at least one of iodide (I) and chloride (Cl).

In this aspect A may be $Cs_xMA_yFA_{1-x-y}$, wherein x is in a range from $0<x<1$, wherein y is in a range from $0<y<1$, and wherein $x+y<1$, wherein B is $Pb_iCd_{1-i}$, wherein i is in a range from $0<i<1$, and when iodide is present, X is $I_mBr_{3-m}$, wherein m is in a range from $0<m<3$, and wherein when only chloride is present, X is $Br_nCl_{3-n}$, wherein n is in a range from $0<n<3$, and wherein when both I and Cl are present, X is $I_kBr_hCl_{3-h-k}$, wherein k is in a range from $0<k<3$, wherein h is in a range from $0<h<3$, and wherein $k+h<3$.

A may be $Cs_{0.05}MA_{0.15}FA_{0.8}$, and B may be $Pb_{0.97}Cd_{0.03}$, and wherein X may be $I_{2.55}Br_{0.45}$.

The present disclosure also provides a perovskite compound having a formula $ABX_3$; wherein A comprises two or more of formamidinium (FA), cesium (Cs), methylammonium (MA), guanidinium (GA), dymethylammonium (DMA), and ethylammonium (EA); wherein B comprises two or more of lead (Pb), cadmium (Cd), zinc (Zn), manganese (Mn), iron (Fe), cobalt (Co), nickel (Ni), copper (Cu), tin (Sn); and wherein X comprises bromide (Br) and at least one of iodide (I) and chloride (Cl).

In this embodiment B may comprise lead (Pb) and at least one of cadmium (Cd) and zinc (Zn).

The present disclosure also provides a perovskite compound having a formula $ABX_3$, wherein A comprises at least two of formamidinium (FA), cesium (Cs), methylammonium (MA), guanidinium (GA), dymethylammonium (DMA), and ethylammonium (EA); wherein B comprises a mixture of lead (Pb) and tin (Sn); and wherein X comprises a mixture of bromide (Br), iodide (I) and chloride (Cl).

The present disclosure also provides a perovskite compound having a formula $ABX_3$; wherein A comprises at least two of formamidinium (FA), cesium (Cs), methylammonium (MA), guanidinium (GA), dymethylammonium (DMA), and ethylammonium (EA); wherein B comprises a mixture of lead (Pb) and tin (Sn), and at least one of cadmium (Cd) and zinc (Zn); and wherein X comprises bromide (Br) and at least one of iodide (I) and chloride (Cl).

The present disclosure also provides a solar cell, comprising a substrate, a first electronically conductive layer on a top surface of the substrate; a layer of an electron transport layer located on a top surface of the electronically conductive layer; a layer of the perovskites disclosed herein on a top surface of the electron transport layer; a hole transport layer located on a top surface of the layer of a perovskite compound; a second electrically conductive layer located on a top surface of the hole transport layer; and the first and second electronically conductive layers having electrically conductive electrodes attached thereto at one end thereof and the other ends of the electrically conductive electrodes being attached to a load such that when light of wavelengths greater than a band gap of the perovskite compound impinge on the solar cell, electrical current is produced.

The layer of perovskite compound may have a thickness in a range from about 50 nm to about 100 microns, and more preferably in a range from about 300 to about 800 nm.

A further understanding of the functional and advantageous aspects of the invention can be realized by reference to the following detailed description and drawings.

BRIEF DESCRIPTION OF THE DRAWINGS

Embodiments will now be described, by way of example only, with reference to the drawings, in which:

FIGS. 1A to 1D relate to characterization of CsMAFA single crystals in which:

FIG. 1A shows the XRD of a ground crystal, confirming the single phase. The peaks were indexed with a cubic crystallographic phase and a=6.25 Å. The inset is the picture of single crystal, FIG. 1B shows the XPS spectrum of Cs 3d levels in a cleaved CsMAFA crystal, FIG. 1C shows the solid-state $^1$HNMR revealing the presence of both formamidinium and methylammonium cations, and FIG. 1D shows the photoluminescence lifetime traces of CsMAFA and FAPbI$_3$ single crystals.

FIGS. 2A to 2B relate to the formation energies of antisites and Schottky vacancies in which:

FIG. 2A describes the symbols used to show ions in perovskite compositions simulated using DFT and the supercell used in DFT calculations, and FIG. 2B shows the formation energies of antisites and Schottky vacancies in FAPbI$_3$ and CsMAFA perovskites. Compositions simulated by DFT: FA$_{108}$Pb$_{108}$I$_{324}$ (FAPbI$_3$), Cs$_2$MA$_{12}$FA$_{94}$Pb$_{108}$Br$_{55}$I$_{269}$ (CsMAFA'), Cs$_8$MA$_{12}$FA$_{88}$Pb$_{108}$Br$_{55}$I$_{269}$ (CsMAFA).

FIGS. 3A to 3C relate to the mechanisms of lattice relaxation in which:

FIG. 3A shows the schematic illustrating the local strain (middle panel), which is reduced either by the formation of point defects (right panel) or by the incorporation of small ions (left panel), and shows the distortion angle (θ=180°−angle(B—X—B')) decreases via strain relaxation, FIG. 3B shows the schematic demonstrating the strain in (002) plane, which is reduced by incorporation of small B/X-site ions, and FIG. 3C shows the B/X isovalent candidates for incorporation.

FIGS. 4A to 4E relate to characterization of CsMAFA, Cl and Cd-contained perovskite films in which:

FIG. 4A shows the normalized photoluminescence intensity of hydroethidine aliquots in which films were aged under light and oxygen blow at 610 nm, representing the yield of superoxide generation, FIG. 4B shows the time-integrated photoluminescence spectra, FIG. 4C shows the time-differentiated photoluminescence traces, FIG. 4D shows the surface SEM image of Cd-contained perovskite solar cells in which the scale bar represents the length of 500 nm, and the power generated by solar cell is collected through front and back electrode, and FIG. 4E shows the cross-section SEM image of Cd-contained perovskite solar cells. The scale bar represents the length of 500 nm.

FIGS. 5A to 5D relate to the performance of CsMAFA, Cl and Cd-containing perovskite solar cells in which:

FIG. 5A shows the power conversion efficiencies of fresh perovskite solar cells with statistics of 30 devices for each composition, fabricated in 4 identical runs, FIG. 5B shows the evolution of power conversion efficiencies of solar cells upon aging in air ambient (RH of 50%), FIG. 5C shows the operation of unencapsulated perovskite solar cells under maximum power point conditions with a 420 nm cutoff UV-filter in air ambient air, and FIG. 5D shows the operation of unencapsulated perovskite solar cells under maximum power point conditions with a 420 nm cutoff UV-filter in nitrogen atmosphere.

FIGS. 6A to 6C relate to XPS profiles in which:

FIG. 6A shows the XPS of Pb 4f in CsMAFA crystals,

FIG. 6B shows the XPS of I 3d in CsMAFA crystals, and

FIG. 6C shows the XPS of Br 3d in CsMAFA crystals.

FIGS. 7A to 7C relate to the lattice strain relaxation mechanism in perovskites in which:

FIGS. 7A and 7B show representation of perovskite structure in cubic close packing model, and FIG. 7C shows close-packed layer in FAPbI$_3$, demonstrating the structural strain, which is reduced either by formation of point defects or by incorporation of small Cs and Br ions.

FIG. 8A to 8D relate to the bond lengths (L) and distortion angles (θ=180°−angle(B—X—B')) in mixed perovskites (N indicates the index of B—X bond and B—X—B' angle within the supercell), measured from DFT supercells, in which:

FIG. 8A shows Pb—X bond lengths,

FIG. 8B shows Pb—X—Pb angles,

FIG. 8C shows Pb—X and Cd—X bond lengths, and

FIG. 8D shows Pb—X—Pb and Cd—X—Pb angles.

FIGS. 9A to 9B relate to tracing superoxide generation by hydroethidine in which:

FIG. 9A shows the oxidation of hydroethidine by superoxide species (formed on perovskite film under illumination) to form red fluorescent dye, and FIG. 9B shows the photoluminescence of probe solution over time during aging of perovskite films under illumination and dry air gassing.

FIGS. 10A to 10C relate to the structure configurations used in DFT calculations of I vacancy formation in which:

FIG. 10A shows the I vacancy configurations. First, the inventors considered eight (8) different random I vacancies in mixed perovskite structures and selected the one with the lowest formation energy (corresponding to the most likely vacancy site). Next, for investigating the role of Cl on halide vacancy formation, the inventors replaced 10I atoms with 10Cl atoms randomly and defined the suppression of vacancy formation due to Cl as:

Figure 10A:
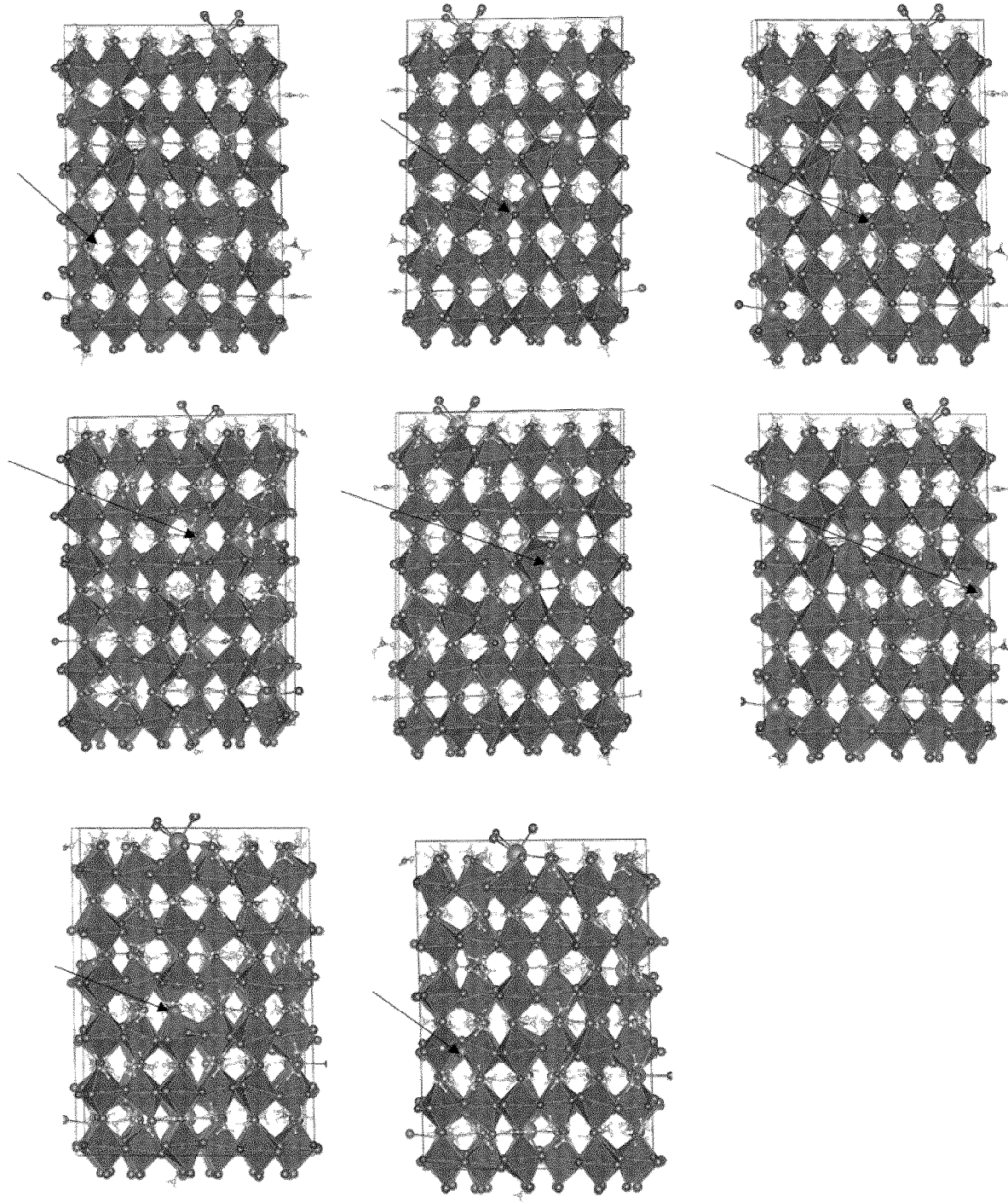
Figure 10B:
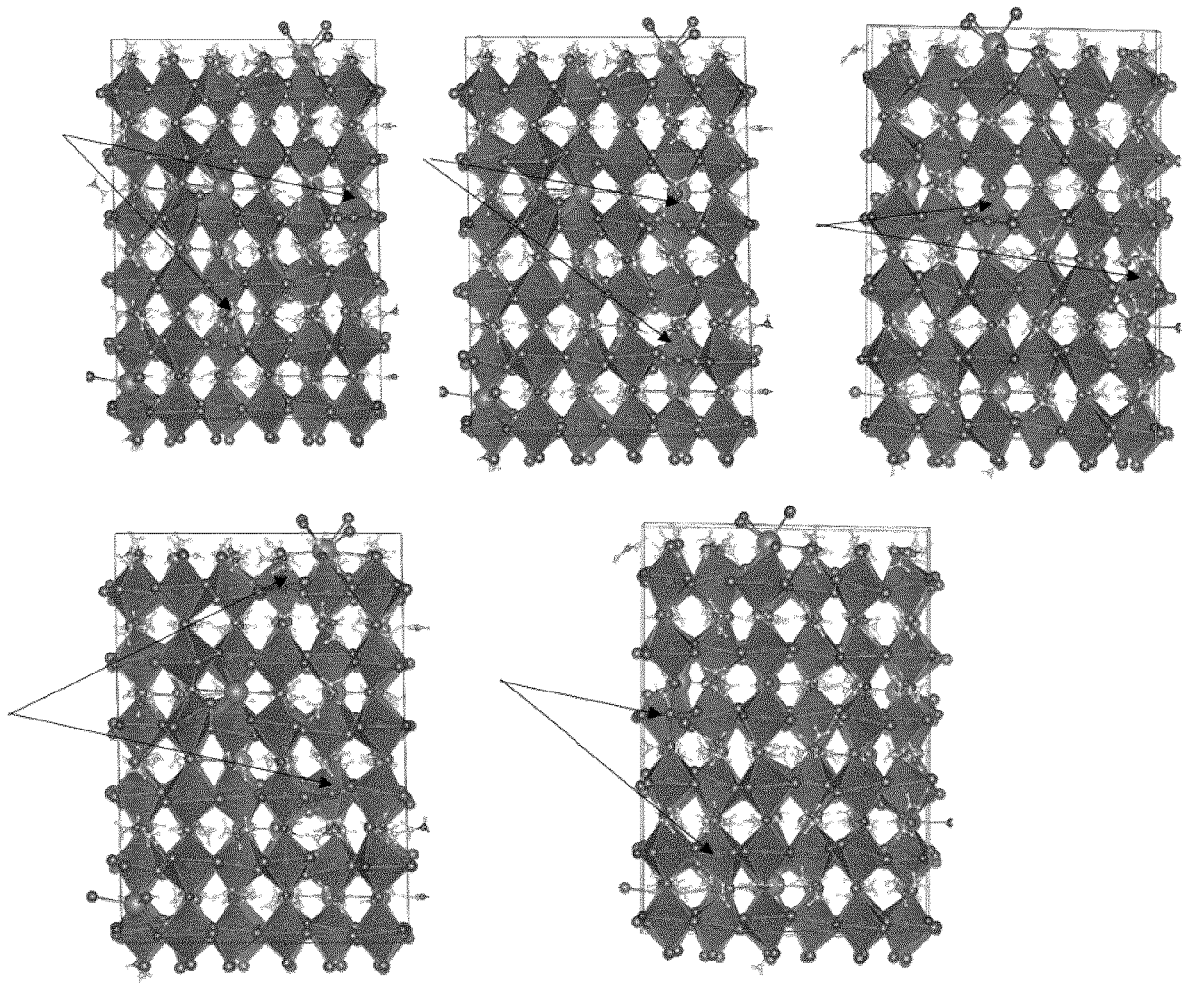

$$\Delta E_{Ivac}^{Cl} = (E_{Ivac}^{Cl} - E^{Cl}) - (E_{Ivac} - E)$$

where $\Delta E_{Ivac}^{Cl}$ is the energy by which I-vacancy formation is suppressed in the presence of Cl atom, $E^{Cl}$, E are energies in the presence and absence of Cl atom, and $E_{Ivac}^{Cl}, E^{Cl}$ are energies of structures with and without I-vacancy. The inventors considered 5 different random position of Cl atom with respect to I-vacancy, FIG. 10B shows metal substitution configurations. For investigating the role of metal (Me=Cd, Hg or Zn) substitution on halide vacancy formation, the inventors replaced 5 Pb atoms with 5 Me atoms randomly and defined the suppression of vacancy formation due to Me as:

$$\Delta E_{Ivac}^{Me} = (E_{Ivac}^{Me} - E^{Me}) - (E_{Ivac} - E)$$

where $\Delta E_{Ivac}^{Me}$ is the energy by which I-vacancy formation is suppressed in the presence of Me atoms. The inventors considered five (5) different random positions of Me atoms with respect to I-vacancy.

Figure 10C:
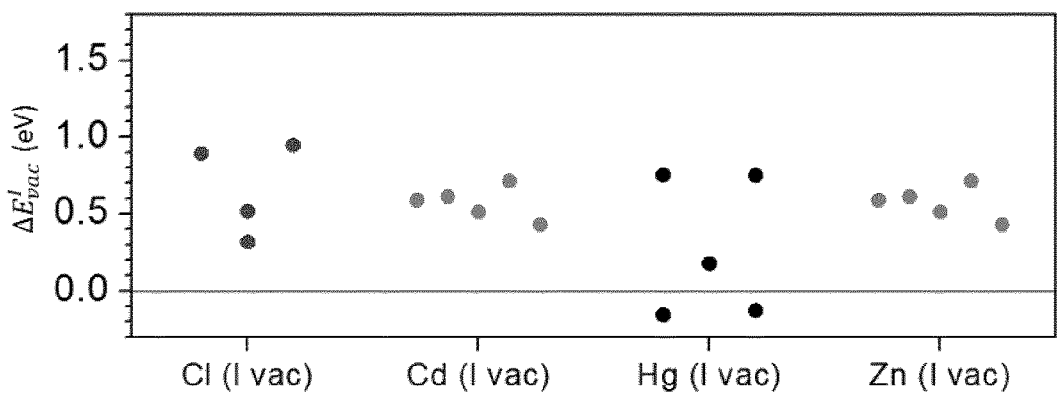

FIG. 10C shows the energy by which I-vacancy formation is changed when ions are substituted (10I with 10Cl; 5Pb with 5Me, Me=Cd, Hg or Zn) in various configurations in $Cs_8MA_{12}FA_{88}Pb_{108}Br_{55}I_{269}$.

Figure 11A:
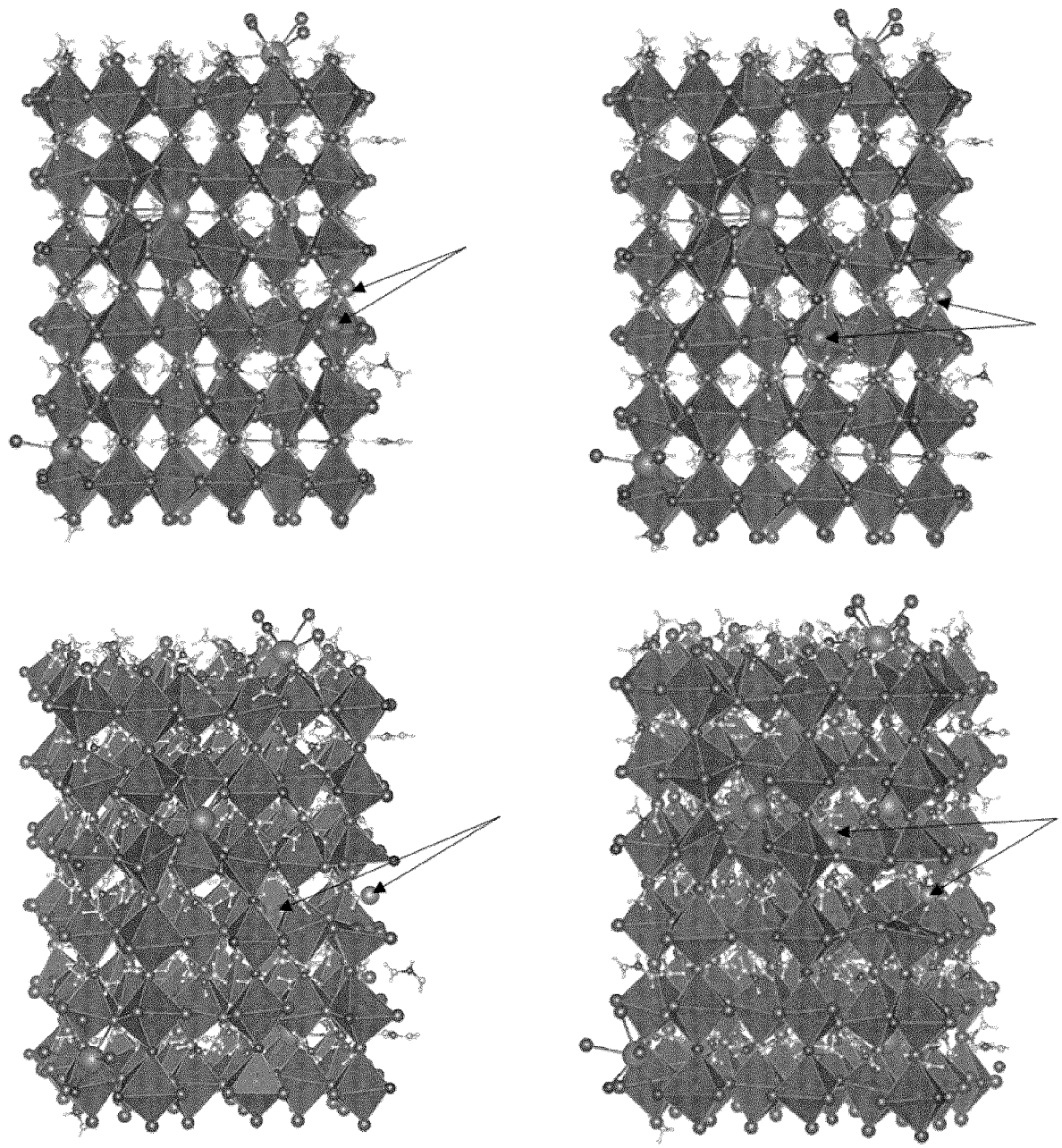
Figure 11B:
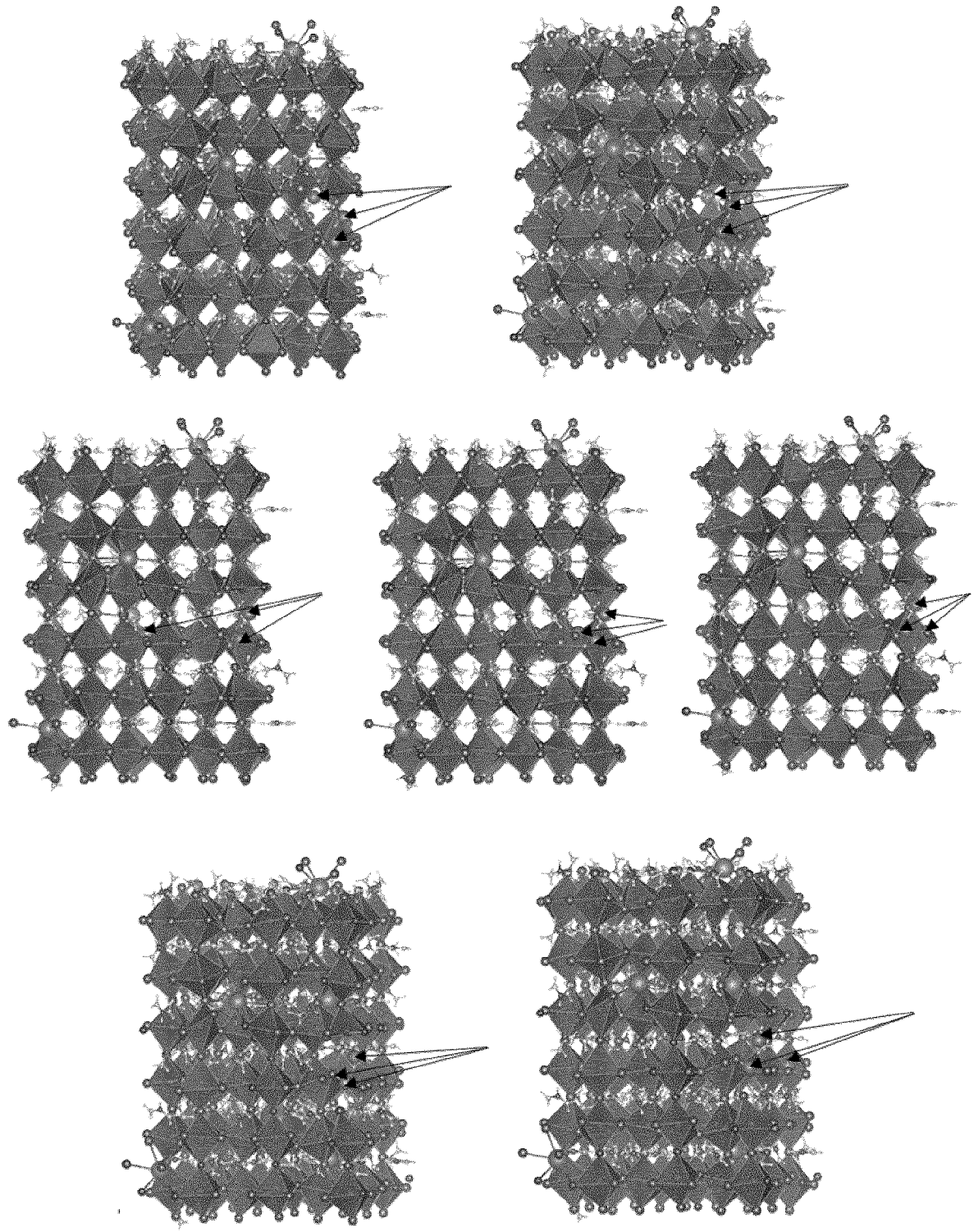
Figure 11C:
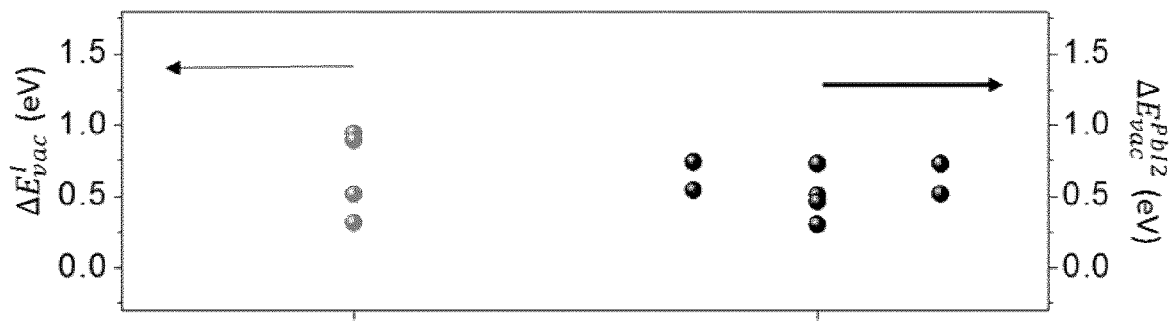

FIGS. 11A to 11C relate to the structure configurations used in DFT calculations for $PbI_2$ vacancy formation in which:

FIG. 11A shows PbI vacancy configurations,

FIG. 11B shows $PbI_2$ vacancy configurations. To investigate the role of Cl on $PbI_2$ vacancy formation, the inventors considered eight (8) different random I vacancies in mixed perovskite structures and selected the one with the lowest formation energy (corresponding to the most likely vacancy site, FIG. 10). Similarly, the inventors found Pb vacancy and another I vacancy formation with the lowest formation energy, thus identifying the most stable $PbI_2$ vacancy. The inventors next replaced one random I atom with Cl in various configurations and obtained the formation energy of $PbI_2$ vacancy in them. The inventors then defined the suppression of vacancy formation due to Cl as:

$$\Delta E_{PbI2vac}^{Cl} = E_{PbI2vac}^{Cl} - E_{PbI2vac}$$

where $E_{PbI2vac}$ is the $PbI_2$ vacancy formation energy in CsMAFA, $E_{PbI2vac}^{cl}$ is the $PbI_2$ vacancy formation energy in the configurations in which an I is replaced by Cl. The inventors considered 7 different random position of Cl atom with respect to $PbI_2$-vacancy. Pb and I vacancies are far apart in a large unit cell. Thus, when a local strain around one site affects the formation of one of the vacancies, the others remain unaffected. In other words, the formation energy of the $PbI_2$ pair is affected to the same extent as the I vacancy.

FIG. 11C shows the energy by which I-vacancy and $PbI_2$-vacancy formation is suppressed when I atom is replaced with Cl atom.

Figure 12A:
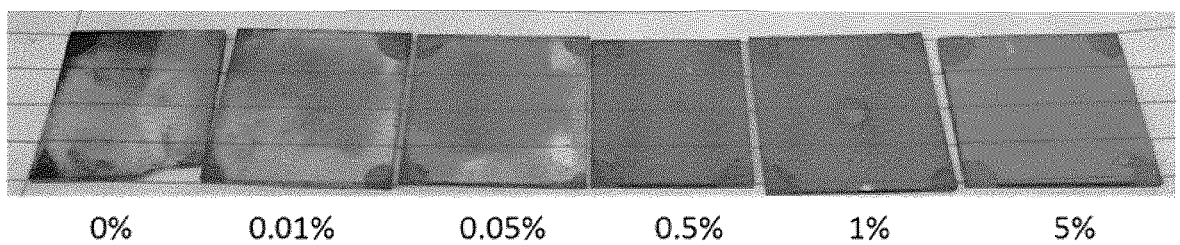
Figure 12B:
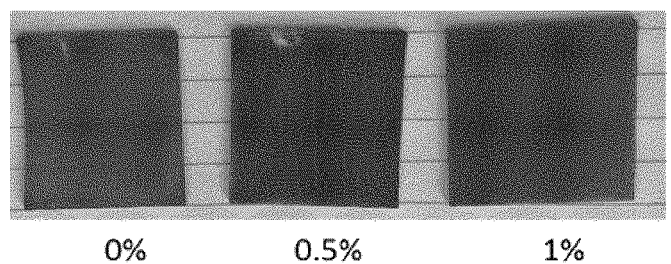
Figure 12C:
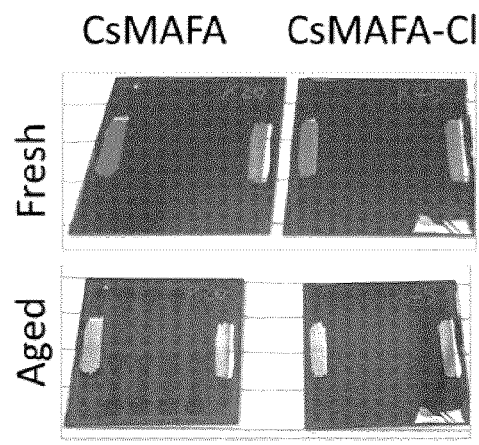

FIGS. 12A to 12C relate to the photo of CsMAFA, Cl-contained perovskite films, and perovskite solar cells after aging in ambient air in which:

FIG. 12A shows the films deposited on glass from 0.7 M solutions after 7 days,

FIG. 12B shows the films deposited from 1.4 M solution after 7 days in which the percentages indicate the concentration of Cl in the feed solution, and FIG. 12C shows the fresh and aged (after 30 days) perovskite solar cells (from 1.4M concentration of precursor solutions) based on CsMAFA and CsMAFA-Cl, demonstrating the bleaching of CsMAFA solar cells. Fresh perovskite films showed the absorption edge at ~775 nm. After heating in air, the intensity of absorption profiles are decreased as a result of reducing of perovskite phase. Time which is require to decrease the absorption for 25% is twice longer for CsMAFA-Cl than that for CsMAFA.

Figure 13A:
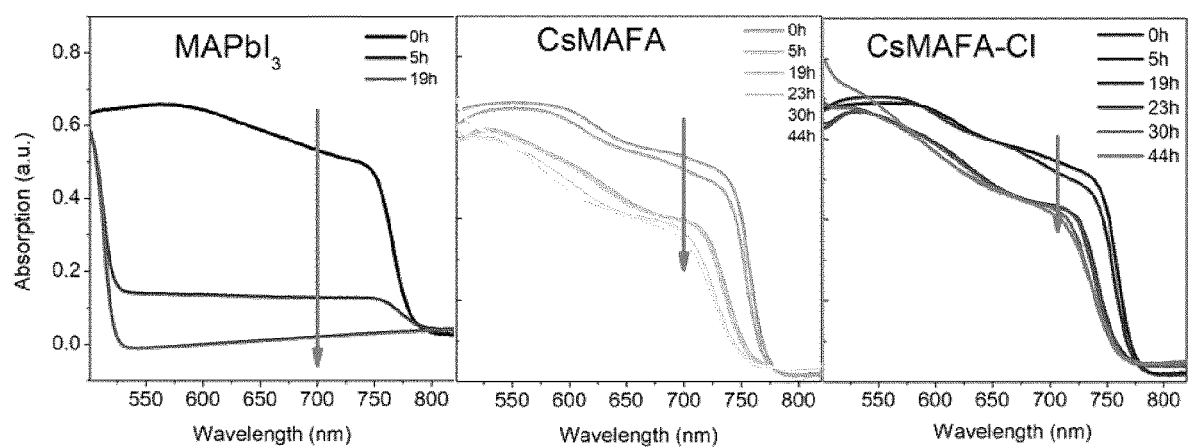
Figure 13B:
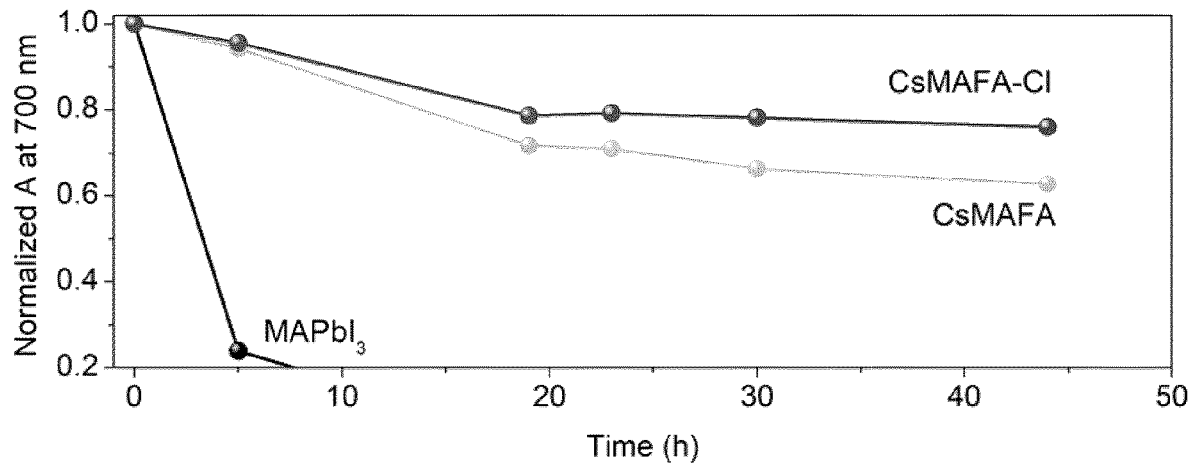

FIGS. 13A to 13B relate to the absorption of perovskite films in which:

FIG. 13A shows the change of absorption of perovskite films on Cl-capped $TiO_2$ (this structure is used in perovskite solar cells) exposed to thermal stress (85° C.) in ambient air with time, and FIG. 13B shows the peak intensity at $\lambda$=700 nm as a function of time I(t), normalized to I(t=0).

Figure 14A:
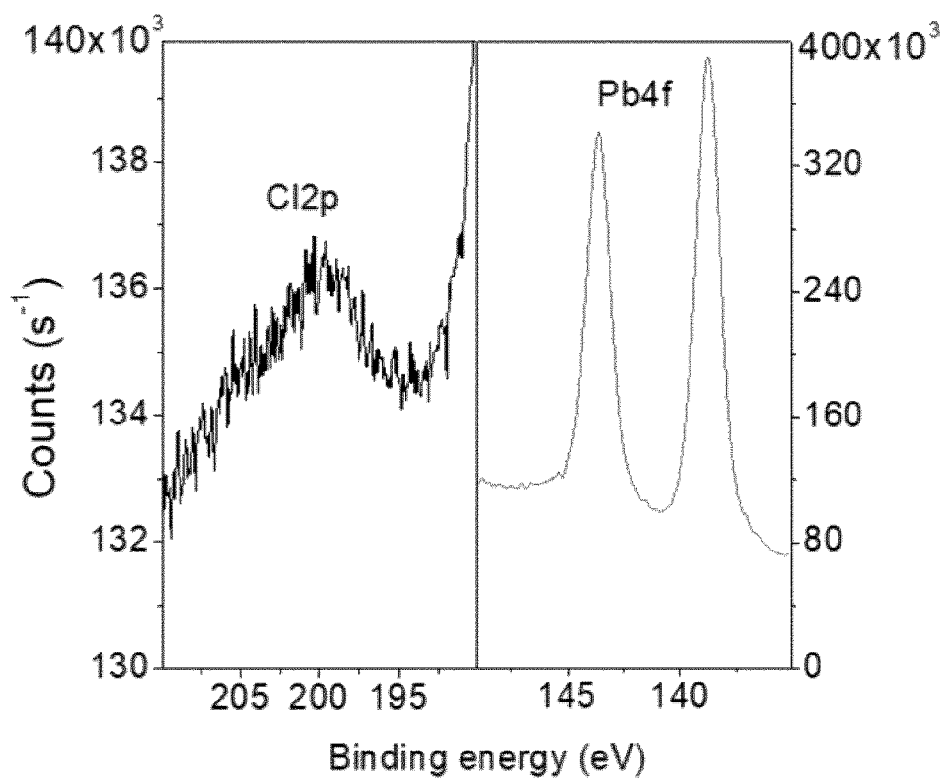
Figure 14B:
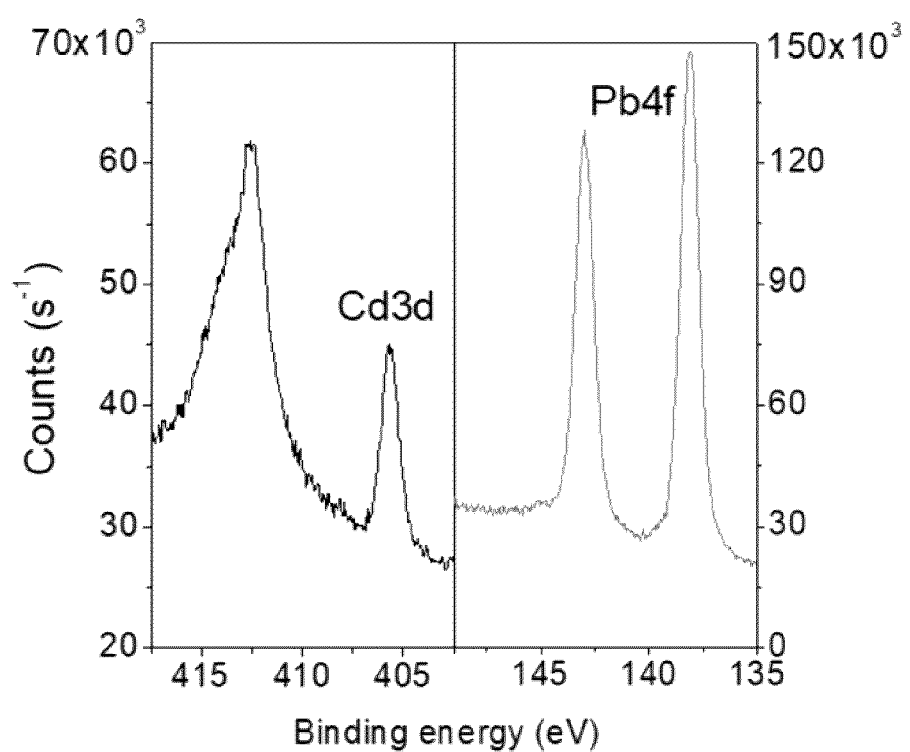

FIGS. 14A to 14B relate to the bulk XPS in which:

FIG. 14A shows the Cl and Pb XPS peaks in corresponding single crystals, indicating incorporation of these in the crystal lattice, and FIG. 14B shows the Cd and Pb XPS peaks in corresponding single crystals, indicating incorporation of these in the crystal lattice.

Figure 15A:
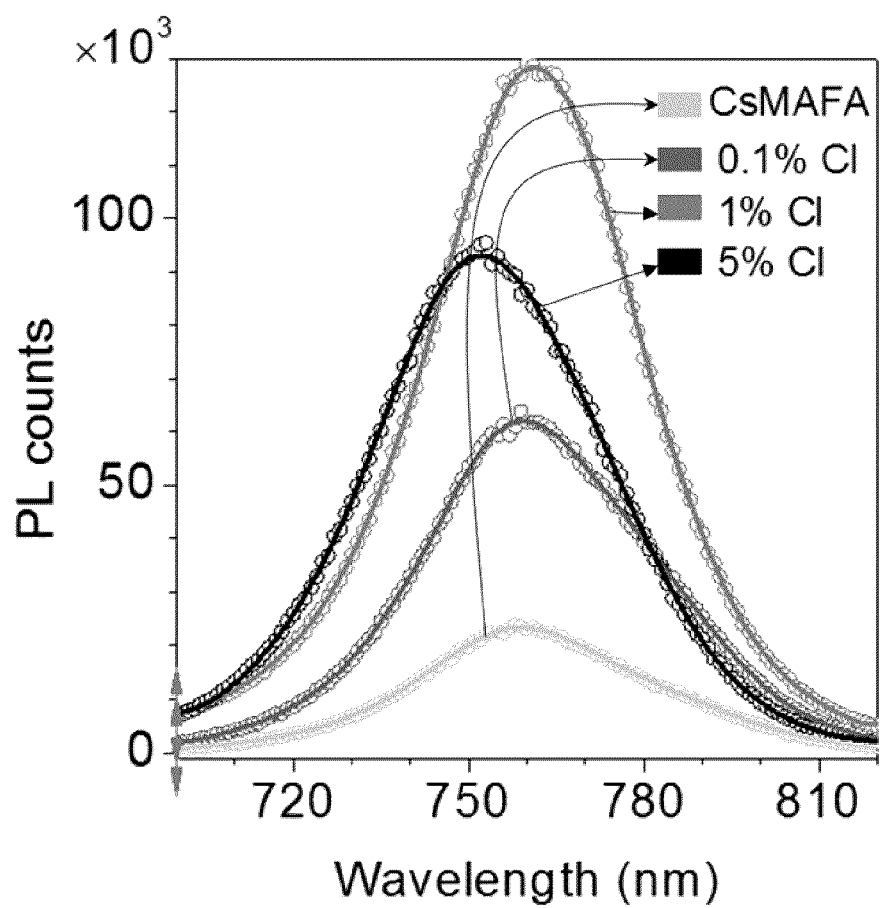

FIG. 15A shows the photoluminescence spectra of CsMAFA films with different Cl contents. Low Cl content did not noticeably affect the position of the PL peak; however, high Cl content (5%) led to a blue-shift of the PL and to a formation of yellow $FAPbI_3$ phase and $PbI_2$, likely because of the rapid precipitation of CsCl, leaving behind FA- and I-rich components that subsequently formed the yellow phase. Hence the inventors focused on the CsMAFA with 1% Cl content.

Figure 15B:
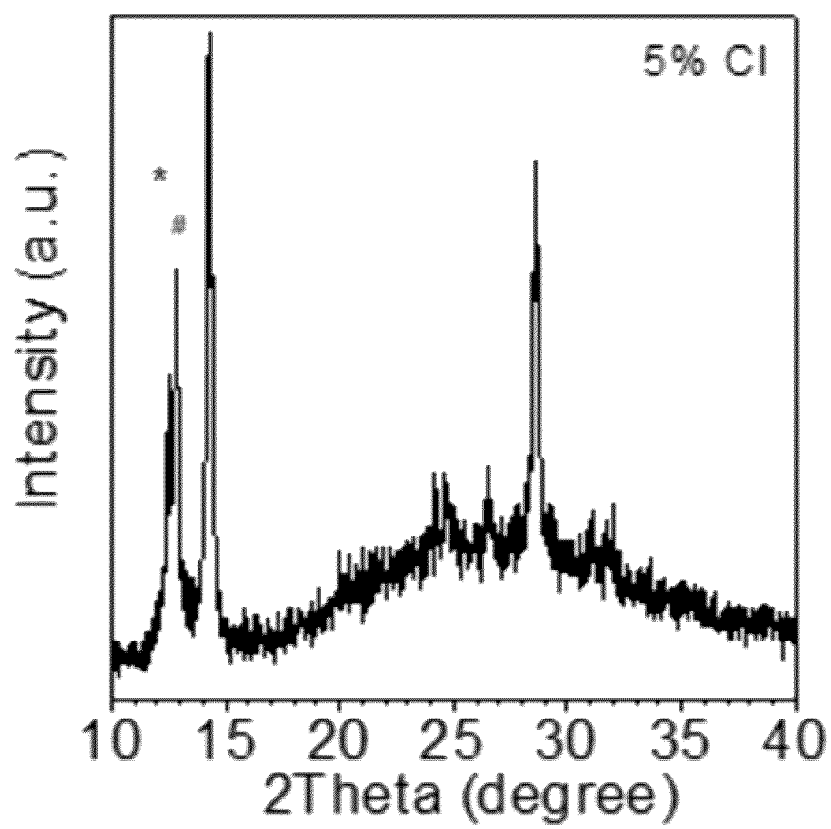

FIG. 15B shows the XRD pattern of CsMAFA films with 5% Cl on glass substrate. The yellow-phase and $PbI_2$ peaks are denoted as * and #, respectively.

Figure 16A:
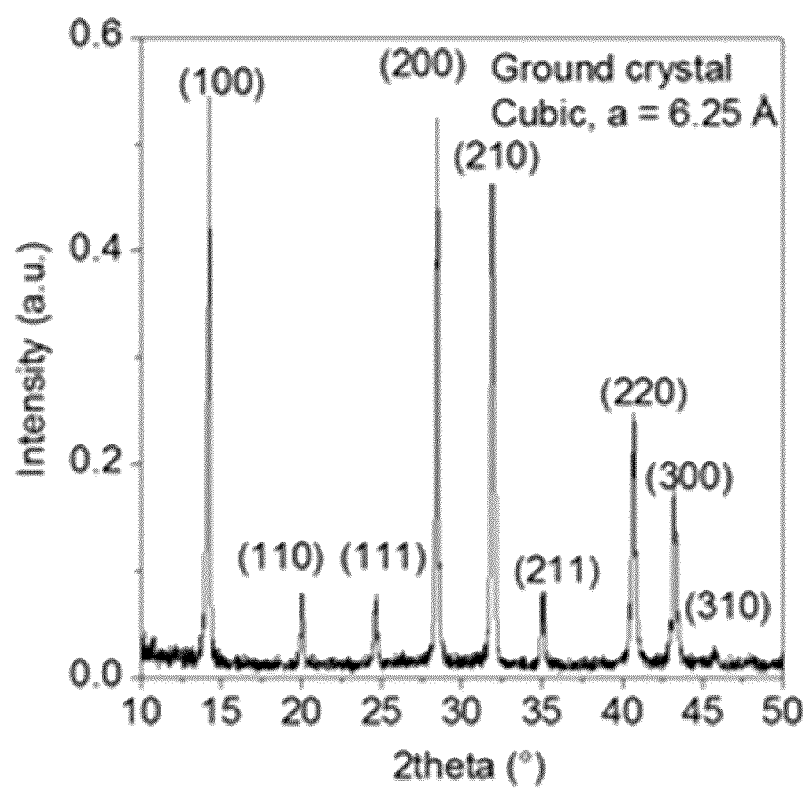
Figure 16B:
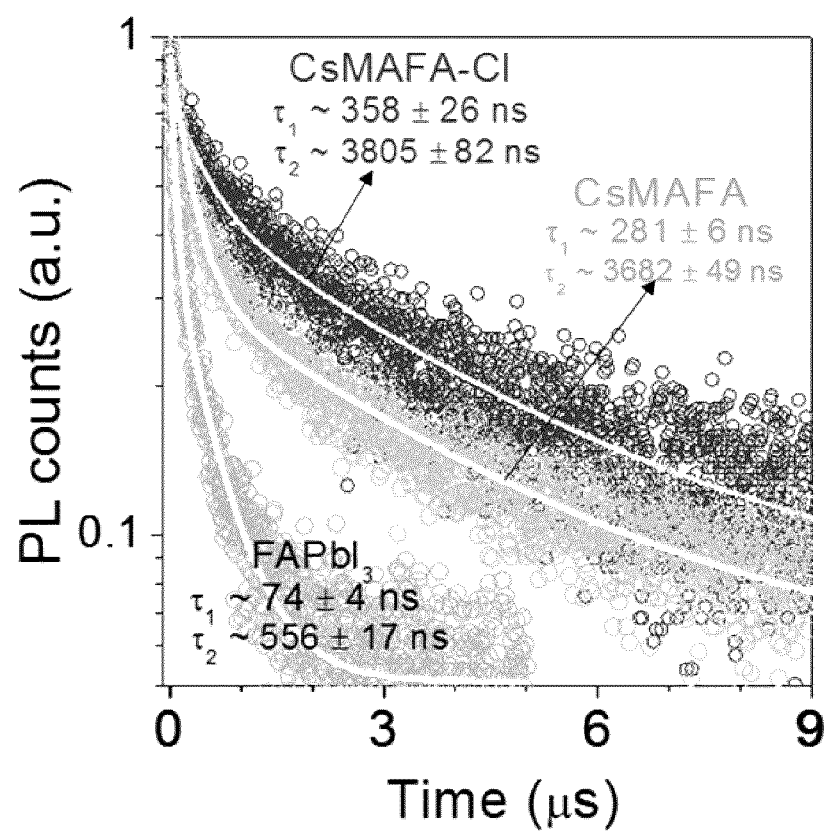

FIGS. 16A to 16B relate to the characterization of CsMAFA-Cl crystals in which:

FIG. 16A shows the powder XRD confirming the purity of crystal, and

FIG. 16B shows the photoluminescence traces revealing that Cl incorporation decreases twofold the integrated contribution of the short recombination term and notably increases the integrated counts of the long recombination term compared to CsMAFA single crystals. The trend was found to be similar for the corresponding thin films.

Figure 17A:
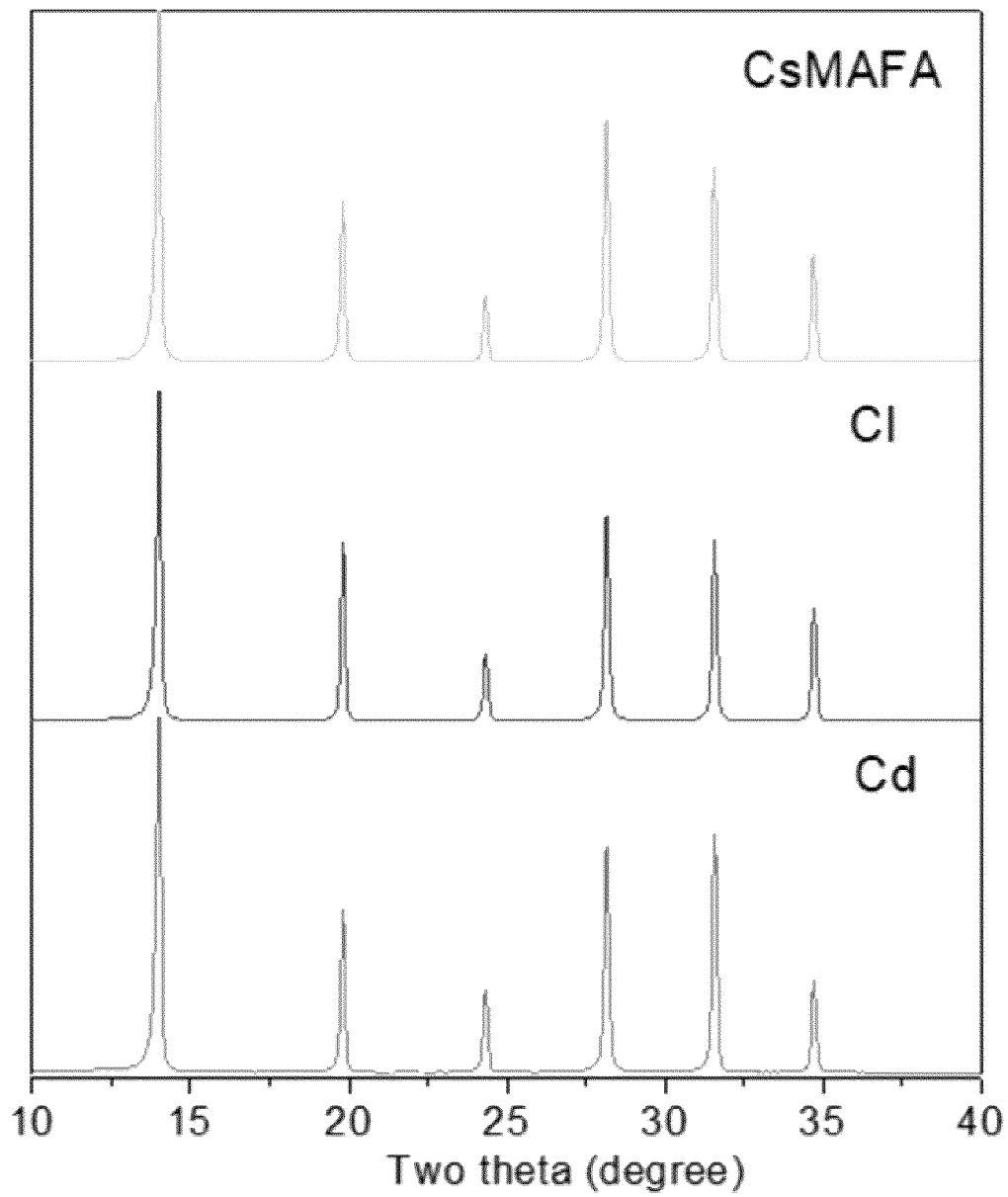
Figure 17B:
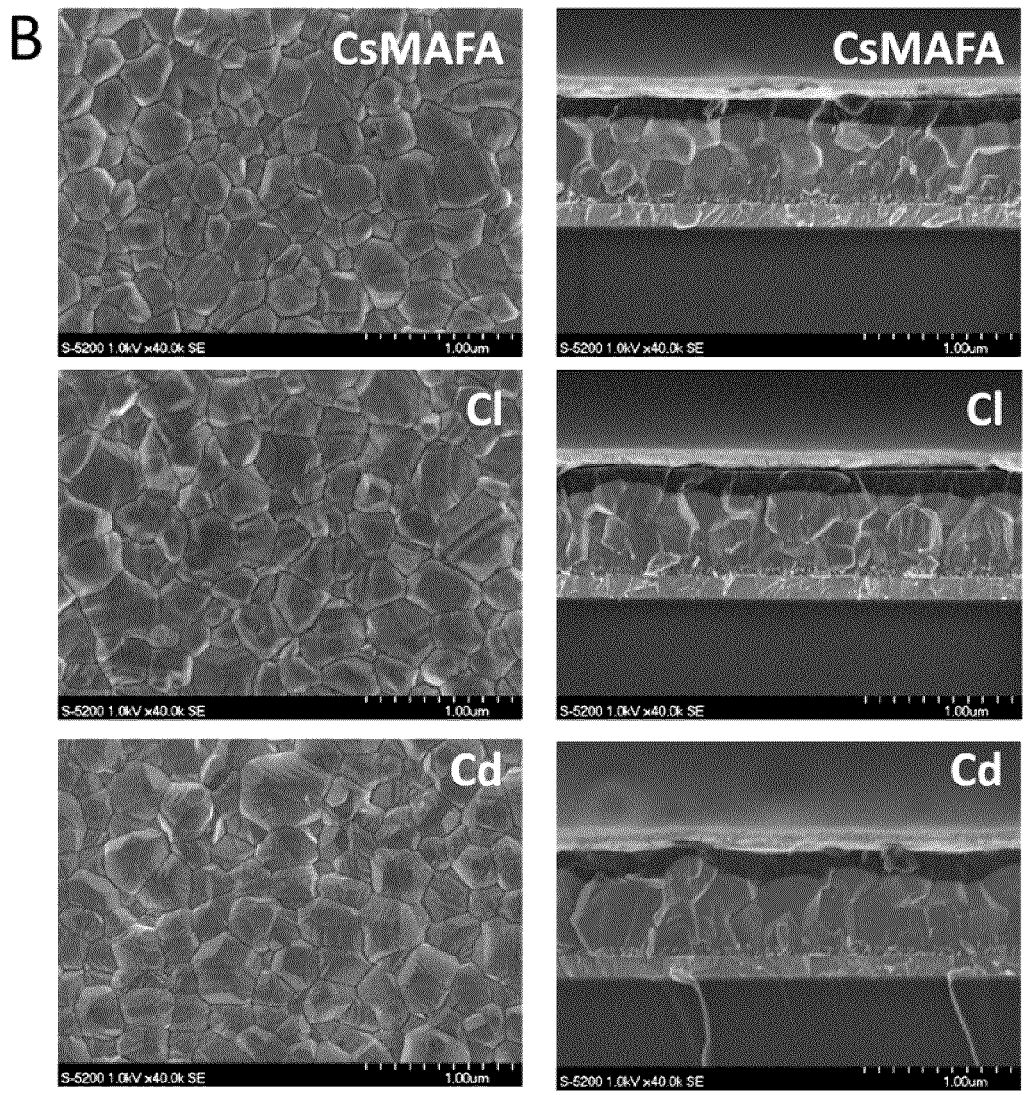

FIGS. 17A to 17B relate to the morphology comparison in which:

FIG. 17A shows the XRD patterns of freshly fabricated CsMAFA, Cd and Cl films, and FIG. 17B shows the Top view SEM images of the films on $TiO_2$/ITO substrate along with the cross-section view SEM images of perovskite solar cells.

Figure 18:
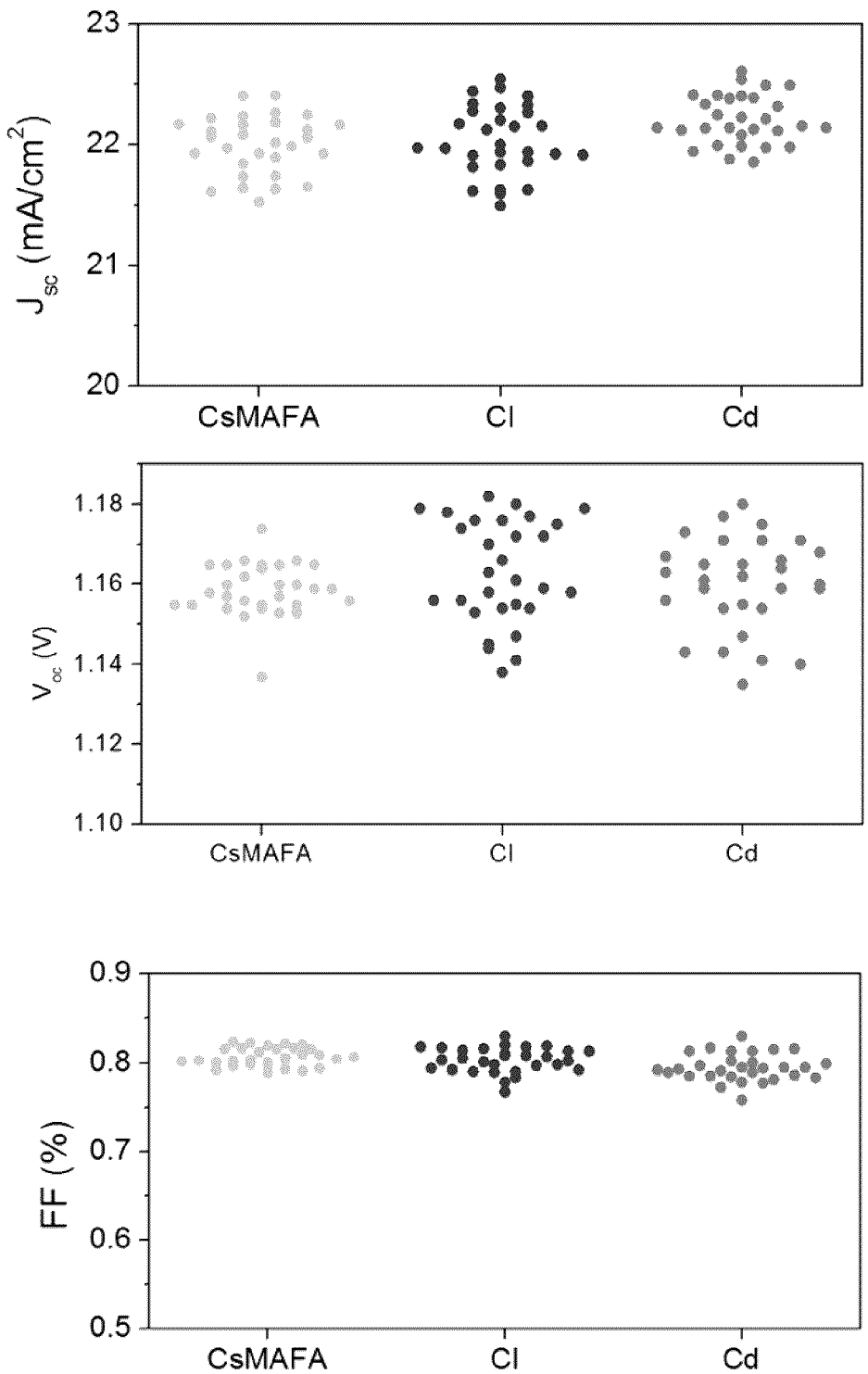

FIG. 18 shows the $J_{sc}$, FF and $V_{oc}$ of freshly fabricated perovskite solar cells.

Figure 19A:
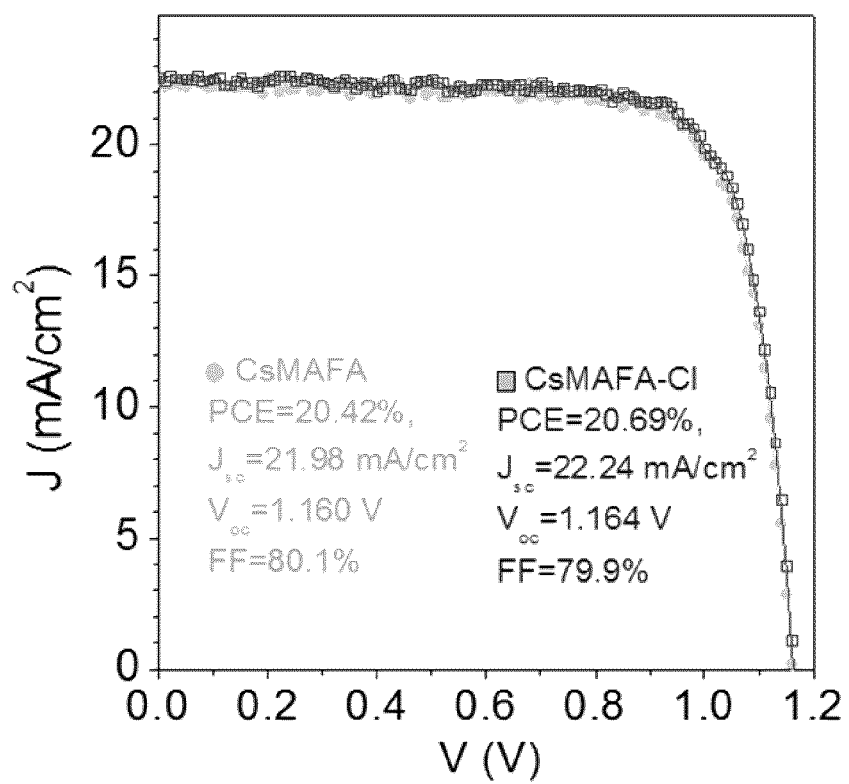

FIG. 19A shows the representative JV curves of perovskite solar cells.

Figure 19B:
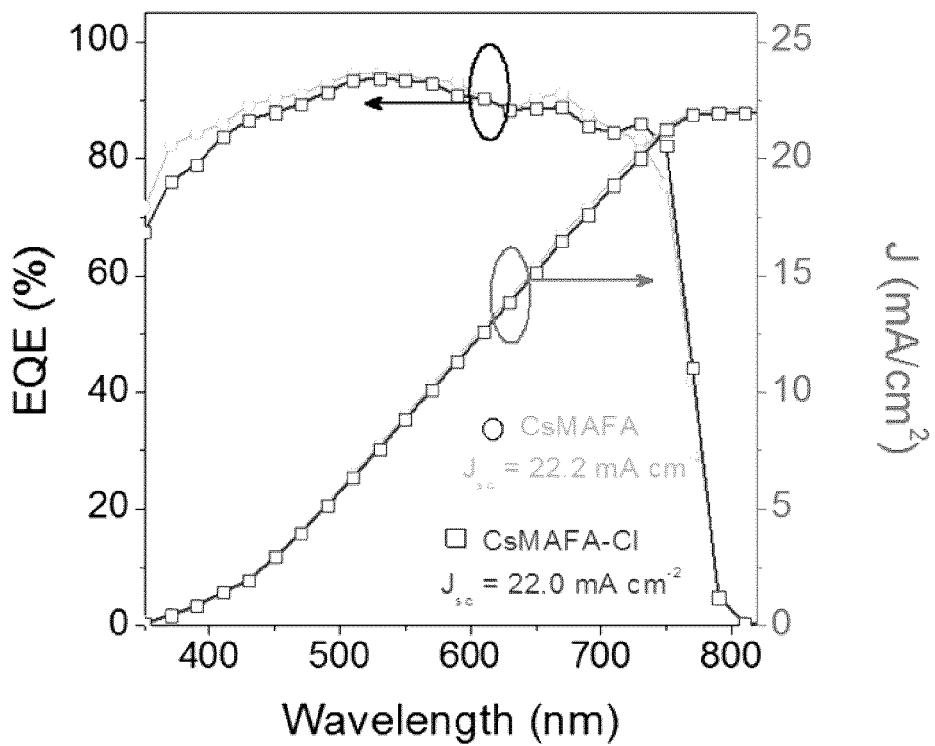

FIG. 19B shows the EQE spectra of corresponding cells, demonstrating current matching with JV curves.

Figure 20:
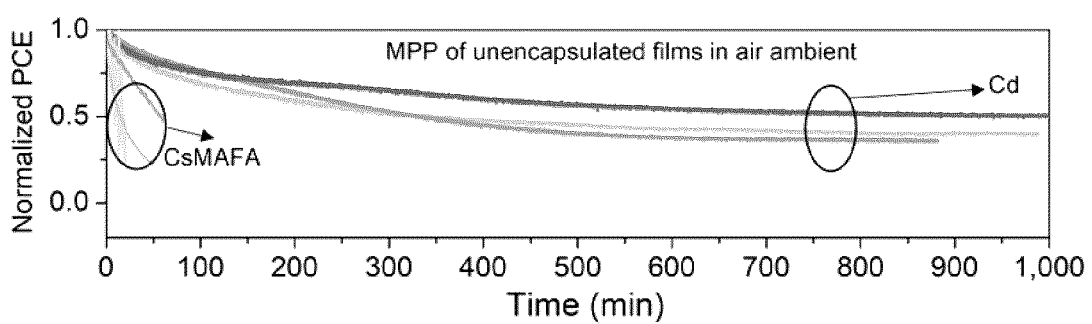

FIG. 20 shows the operation of unencapsulated perovskite solar cells under maximum power point conditions in air ambient.

Figure 21:
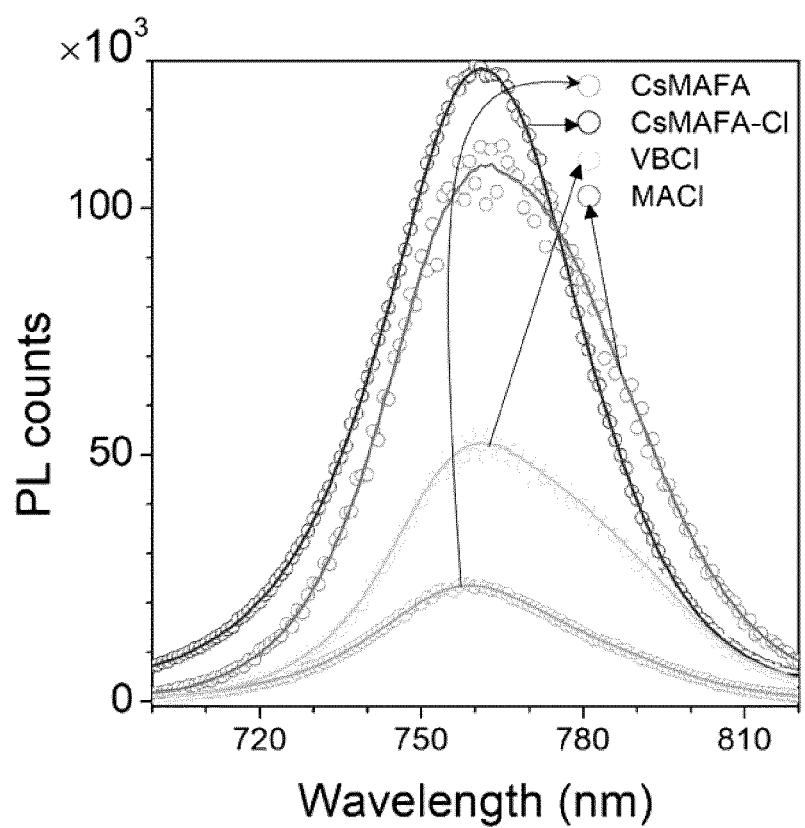

FIG. 21 shows the photoluminescence spectra of CsMAFA films passivated with MACl and VBCl.

Figure 22:
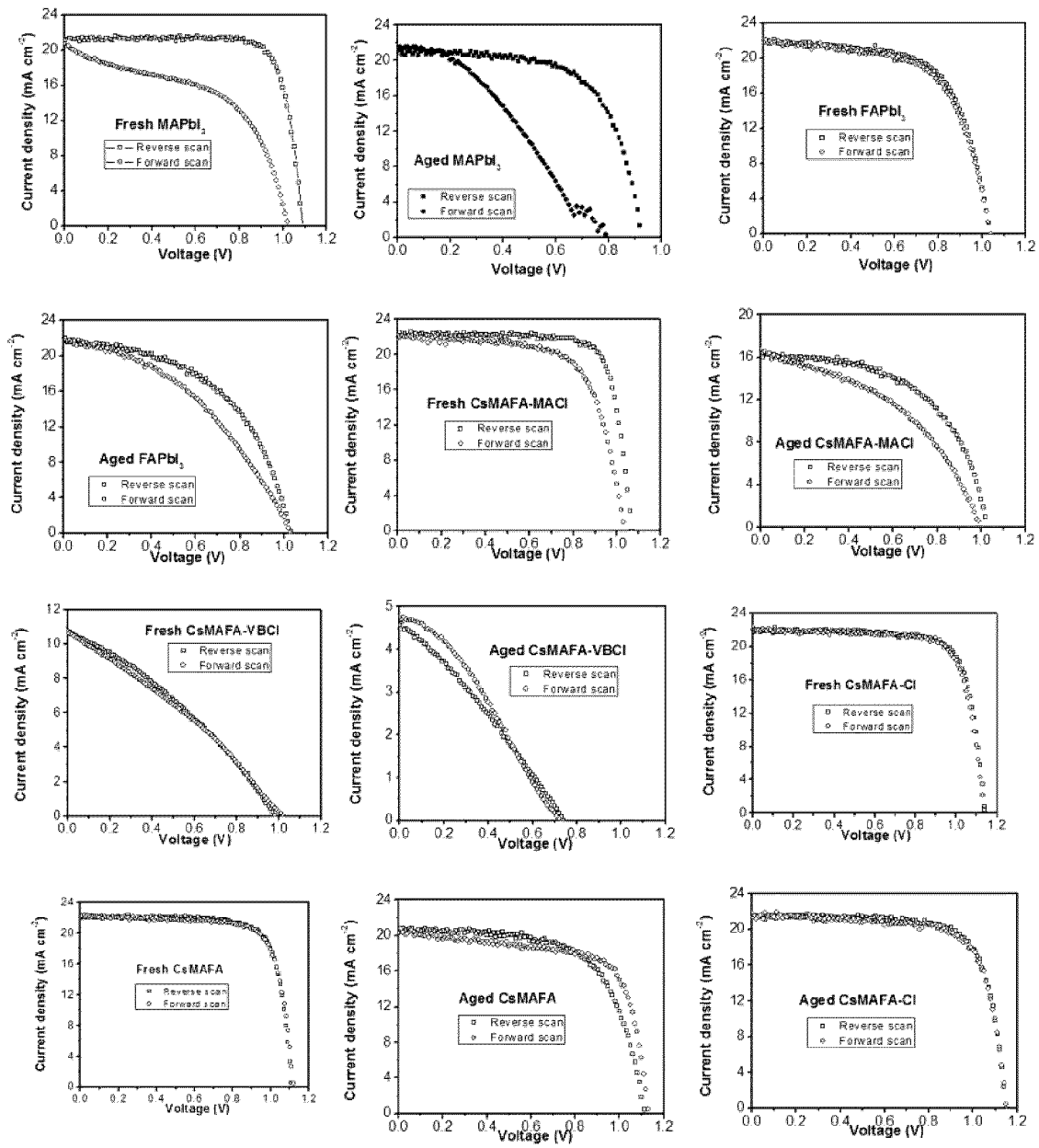

FIG. 22 show the JV curves of fresh and aged devices.

Figure 23:
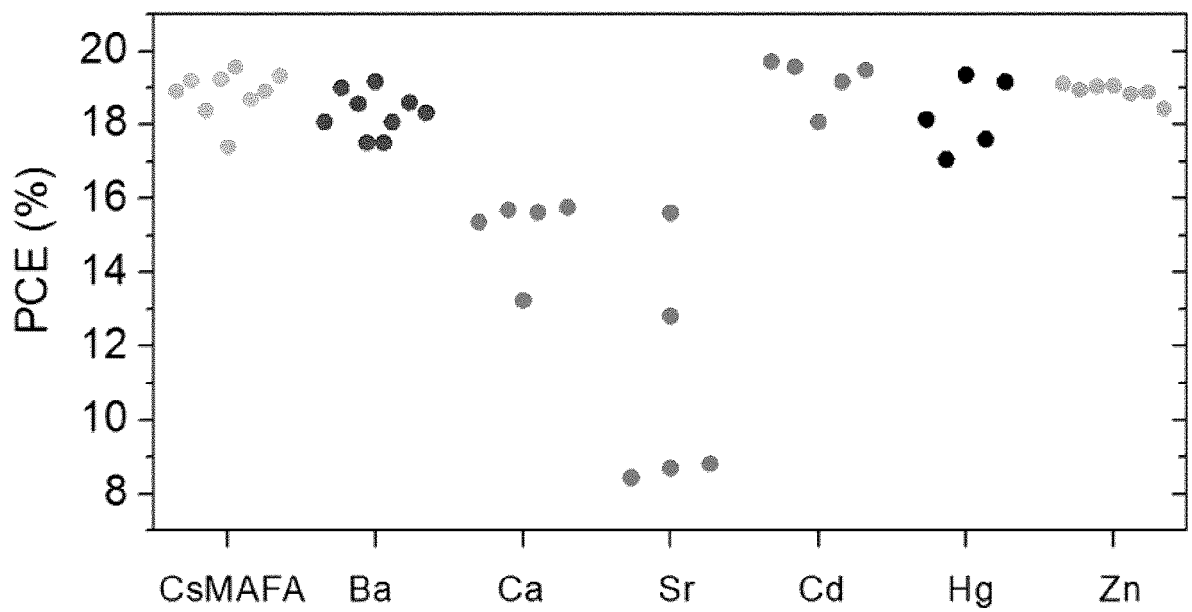

FIG. 23 shows the power conversion efficiencies of freshly fabricated perovskite solar cells with different dopants fabricated in the same batch.

Figure 24:
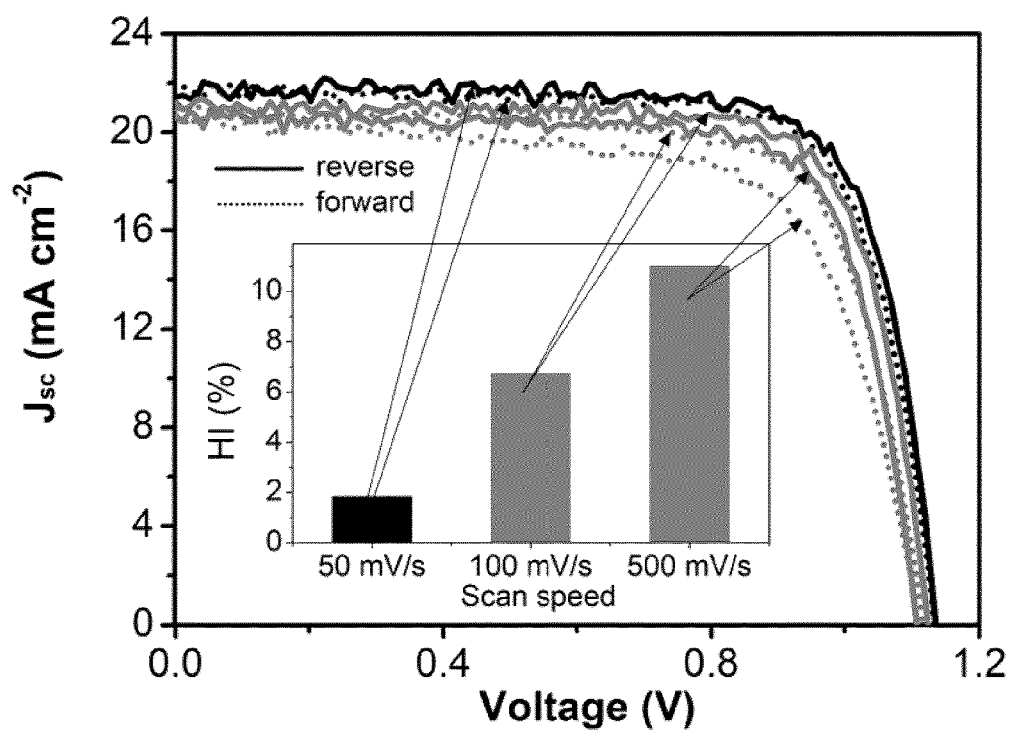

FIG. 24 shows the dependence of Hysteresis Index $$\left( HI = \frac{PCE_{reverse} - PCE_{forward}}{PCE_{reverse}} \times 100\% \right)$$

on scan rate.

DETAILED DESCRIPTION

Without limitation, the majority of the systems described herein are directed to an air stable perovskites and methods of synthesizing the same. As required, embodiments of the present invention are disclosed herein. However, the disclosed embodiments are merely exemplary, and it should be understood that the invention may be embodied in many various and alternative forms.

The accompanying figures, which are not necessarily drawn to scale, and which are incorporated into and form a part of the instant specification, illustrate several aspects and embodiments of the present disclosure and, together with the description therein, serve to explain the principles of the process of producing air stable perovskites. The drawings are provided only for the purpose of illustrating select embodiments of the apparatus and as an aid to understanding and are not to be construed as a definition of the limits of the present disclosure. For purposes of teaching and not limitation, the illustrated embodiments are directed to air stable perovskites.

As used herein, the term "about", when used in conjunction with ranges of dimensions, temperatures or other physical properties or characteristics is meant to cover slight variations that may exist in the upper and lower limits of the ranges of dimensions so as to not exclude embodiments where on average most of the dimensions are satisfied but where statistically dimensions may exist outside this region.

For all the embodiments disclosed herein, the brutto-formula of halide perovskite is $ABX_3$, where A is a monovalent organic or inorganic cation or their mixtures, B is a divalent cation and their mixtures, and X is a halide anion or their mixtures. The stoichiometry of A, B and X in $ABX_3$ is such that the number of A species add up to one (1), B's add up to one (1), and X's add up to three (3).

Thus in an embodiment, the present disclosure provides the following compounds $ABX_3$, where A contains formamidinium (FA), cesium (Cs) and methylammonium (MA), B is a mixture of lead (Pb) and cadmium (Cd), and X includes bromide (Br) and at least one of two components of iodide (I) and chloride (Cl).

In a specific embodiment A is $Cs_xMA_yFA_{1-x-y}$, wherein x is in a range from 0<x<1, wherein y is in a range from 0<y<1, and wherein x+y<1, wherein B is $Pb_iCd_{1-i}$, wherein i is in a range from 0<i<1, and when iodide is present, X is $I_mBr_{3-m}$, wherein m is in a range from 0<m<3, and wherein when only chloride is present, X is $Br_nCl_{3-n}$, wherein n is in a range from 0<n<3, and wherein when both I and Cl are present, X is $I_kBr_nCl_{3-n-k}$, wherein k is in a range from 0<k<3, wherein h is in a range from 0<h<3, and wherein k+h<3.

In another specific embodiment A is $Cs_{0.05}MA_{0.15}FA_{0.8}$, and B is $Pb_{0.37}Cd_{0.03}$, and X is $I_{2.55}Br_{0.45}$.

In another embodiment the present disclosure provides the following compounds $ABX_3$, where A contains at least two constituents of formamidinium (FA), cesium (Cs), methylammonium (MA), guanidinium (GA), dymethylammonium (DMA), ethylammonium (EA), wherein B comprises two or more of lead (Pb), cadmium (Cd), zinc (Zn), manganese (Mn), iron (Fe), cobalt (Co), nickel (Ni), copper (Cu), tin (Sn), germanium (Ge); and wherein X comprises bromide (Br) and at least one of iodide (I) and chloride (Cl).

In a specific embodiment B comprises lead (Pb) and at least one of cadmium (Cd) and zinc (Zn).

It was observed that synthesized embodiments for this perovskite system in which the B species included mercury (Hg), calcium (Ca), strontium (Sr) and barium (Ba) did not work.

In another embodiment, the present disclosure refers to the following compounds $ABX_3$, where A contains at least two components of formamidinium (FA), cesium (Cs), methylammonium (MA), guanidinium (GA), dymethylammonium (DMA), ethylammonium (EA), and X contains a mixture of bromide (Br), iodide (I) and chloride (Cl), B contains a mixture of lead (Pb) and tin (Sn).

In another aspect, the present disclosure refers to the following compounds $ABX_3$, where A contains at least two components of formamidinium (FA), cesium (Cs), methyl-ammonium (MA), guanidinium (GA), dymethylammonium (DMA), ethylammonium (EA), and X contains bromide (Br) and at least one of two components of iodide (I) and chloride (Cl), B contains a mixture of lead (Pb) and tin (Sn), and at least one of two components of cadmium (Cd) and zinc (Zn).

Solar Cells

The perovskite compounds disclosed herein are useful for use in solar cells. FIG. 4E shows a cross-section SEM image of Cd-contained perovskite solar cells in which the scale bar represents the length of 500 nm. A substrate (such as glass) is coated with an electronically conductive indium tin oxide (ITO) layer onto which the perovskite layer comprised of the perovskite compounds disclosed herein are deposited. A layer of $TiO_2$—Cl is then deposited onto the ITO layer. $TiO_2$—Cl is an electron transporting layer (ETL). Alternative ETLs include doped and undoped oxides, such as tin oxide ($SnO_2$), Al-doped zinc oxide (ZnO), and organic compounds, such as Phenyl C61 Butyric Acid Methyl Ester (PCBM). They can be deposited by spin coating of nanoparticles or molecular solution, spray coating, sputtering, chemical vapor deposition (CVD), chemical bath deposition (CBD).

A perovskite layer comprised of the $ABX_3$ compounds disclosed herein is then deposited on top of the $TiO_2$—Cl. The perovskite films were deposited with a two-step spin-coating procedure. The first step was 1,000 r.p.m. for 10 seconds (s), and the second step was 6,000 r.p.m. for 20 s. Chlorobenzene (150 µl) was dropped on the spinning substrate during the second spin-coating step at 5 s before the end of the procedure. The substrate was then immediately transferred onto a hotplate and heated at 100° C. for 30 min. Alternatively, perovskite can be deposited through sequential deposition, thermal evaporation, and their combination. The perovskite layer may have a thickness in a range from about 50 nm to about 100 microns, and more preferably has a thickness in a range from about 300 to about 800 nm.

A layer of Spiro-OMe-TAD (2,2',7,7'-Tetrakis[N,N-di(4-methoxyphenyl)amino]-9,9'-spirobifluorene) is then deposited on top of the perovskite layer. Spiro-OMe-TAD is a hole transporter layer (HTL). Alternative HTLs include inorganic compounds, such as nickel oxide (NiO), copper thiocyanate (CuSCN), copper oxide ($Cu_2O$), tungsten oxide ($WO_3$), and organic compounds, such as poly(3-hexylthiophene) (P3HT), poly[bis(4-phenyl)(2,4,6-trimethylphenyl)amine] (PTAA), poly[5,5-bis(2-butyloctyl)-(2,2-bithiophene)-4,4'-dicarboxylate-alt-5,5'-2,2'-bithiophene] (PDCBT). They can be deposited by spin coating of nanoparticles or molecular solution, spray coating, sputtering, chemical vapor deposition (CVD), chemical bath deposition (CBD), thermal evaporation.

Once the layer of Spiro-OMe-TAD has been deposited, a gold (Au) electrically conductive layer is deposited to form the solar cell. Alternative conductive layers are silver (Ag), copper (Cu), indium-tin oxide (ITO). They can be deposited by thermal evaporation, e-beam deposition and sputtering.

Electrodes are then attached to the two electrically conductive layers which are also connected to a load. The materials making up the front electrically conductive layers and the hole and electron transport layers are transparent to light of energy greater than the bandgap of the particular $ABX_3$ compound being used to ensure light travels through the various layers to enter the $ABX_3$ layer to excite electrons from the valence band to the conduction band which are then separated in opposite directions to produce a current which flows through the load thus doing work.

The present disclosure will now be illustrated with the following non-limiting example using a specific $ABX_3$ compound.

Example

Here we report that in single cation/halide $FAPbI_3$, local lattice strain induces the formation of point defects, recently shown to be a major source of degradation in PSCs. The inventors then show that incorporation of Cs/MA/Br ions in the state-of-art CsMAFA perovskite ($Cs_{0.05}MA_{0.15}FA_{0.8}PbI_{2.55}Br_{0.45}$—the same composition as in the best-performing PSCs) has a high energy of formation for vacancies, consistent with this material's impressive initial performance. However, the inventors also show that such defects, even if rare, have high affinity to water and oxygen molecules; and that even a small density of them is highly detrimental. Further increasing Cs/Br content blue-shifts the bandgap, which works against PSC power conversion efficiency.

The inventors therefore sought new strategies to suppress vacancy formation, and report herein the incorporation of judiciously-selected B-site dopants into the lattice of mixed perovskite crystals. Cadmium (Cd) was incorporated into a mixed perovskite lattice, releasing remaining lattice strain and further increasing the energetic cost associated with the formation of vacancies. The resultant unencapsulated PSCs show significantly extended stability: they maintain >90% of their initial PCE after 30 days of storage in air ambient at a relative humidity (RH) of 50%. They also show an order of magnitude longer operating MPP lifetime under these same air ambient RH conditions compared to state-of-art CsMAFA perovskite solar cells.

Properties of CsMAFA Single Crystals

Figure 1A:
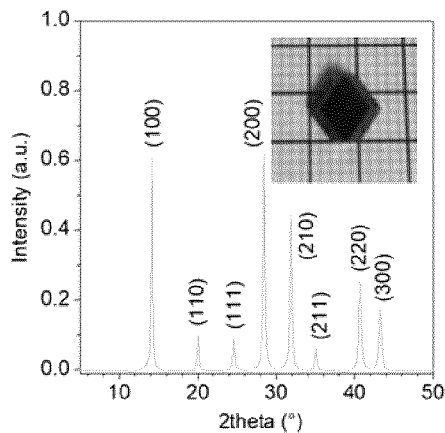
Figure 1B:
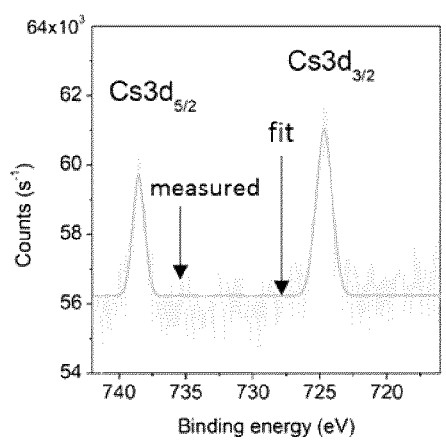
Figure 1C:
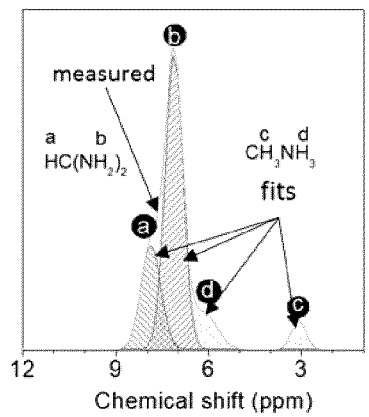
Figure 1D:
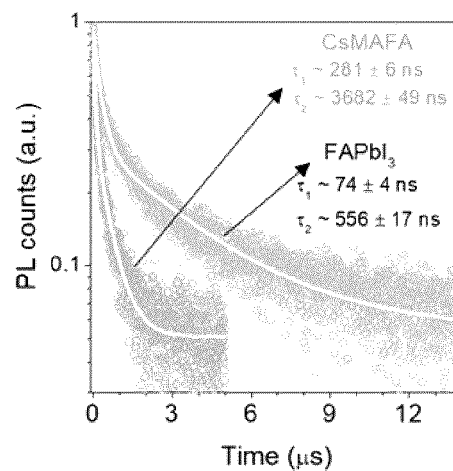
Figure 6A:
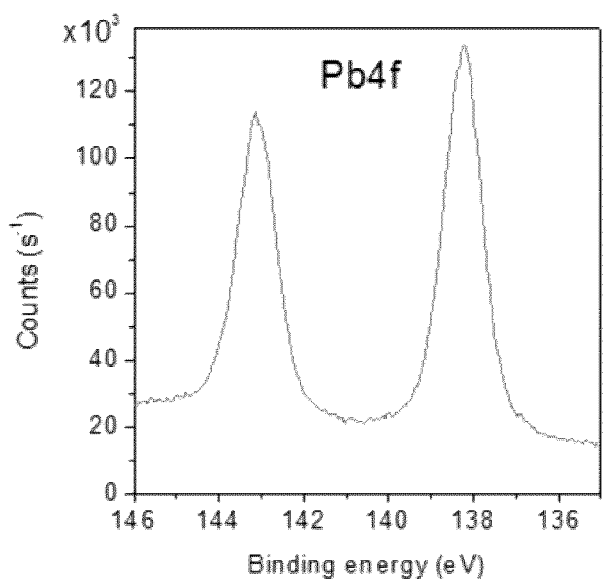
Figure 6B:
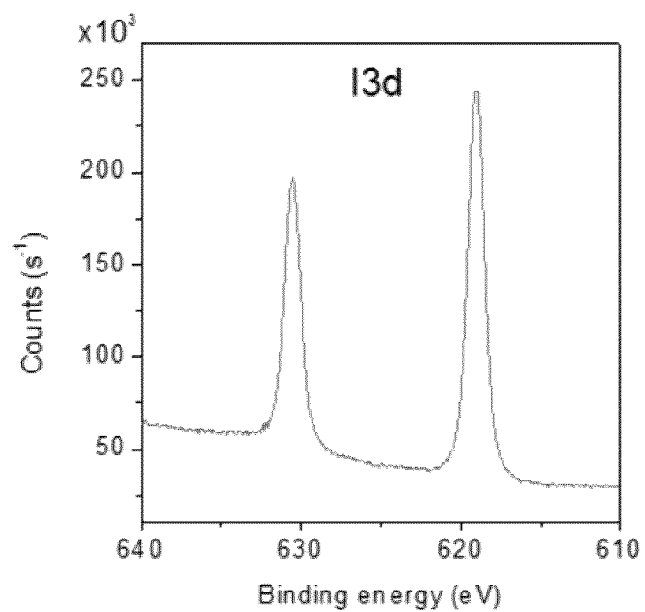
Figure 6C:
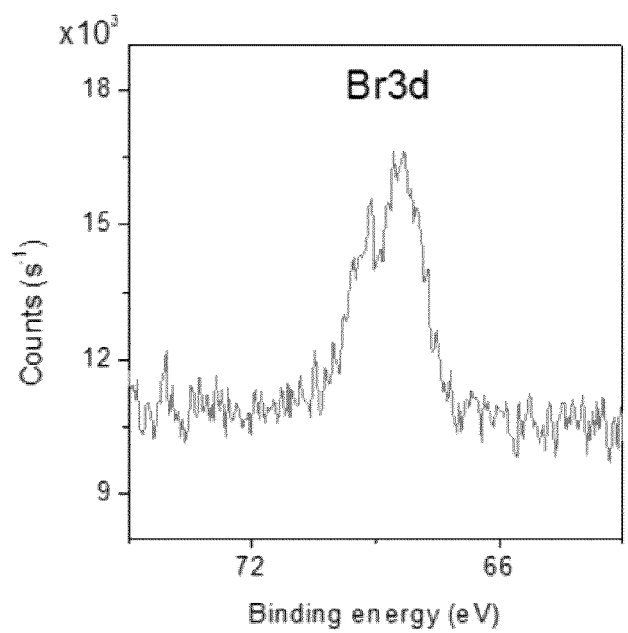

The inventors sought first to understand why mixed CsMAFA perovskites perform better in solar cell active layers than $MAPbI_3$ or $FAPbI_3$. To put our focus initially on bulk crystal properties, i.e. excluding the effects of grain boundaries that are abundant in thin films, the inventors first studied the properties of CsMAFA single crystals. The inset of FIG. 1a shows a ~7 mm×7 mm×3 mm CsMAFA crystal synthesized via inverse temperature crystallization (ITC)[8]. The powder X-ray diffraction (PXRD) of ground crystals showed a single cubic phase with a unit cell parameter of a=6.25 Å (FIG. 1a), slightly smaller than that of $FAPbI_3$ (a=6.36 Å), indicating the successful incorporation of Cs and Br within the crystal lattice. The amount of Cs (FIG. 1b), Pb, I, and Br (FIG. 6) was quantified using X-ray photoelectron spectroscopy (XPS), and MA and FA by solid-state hydrogen nuclear magnetic resonance ($^1$HNMR) (FIG. 1c). An elemental composition in the crystal was found to be similar to that in the feed solution (Table 2). Photoluminescence (PL) lifetime measurements of CsMAFA single crystals (FIG. 1d) revealed remarkably long carrier lifetimes (~0.3 and ~3.7 μs of fast and slow components, respectively). These values are up to six times greater than those of identically grown black $FAPbI_3$ single crystals (FIG. 1d) and $MAPbI_3$[8], pointing to substantially reduced trap states in CsMAFA. This finding agrees with the improved performance of mixed perovskites relative to single cation/halide perovskites.

Lattice Strain Relaxation Mechanisms in Perovskites

Figure 2A:
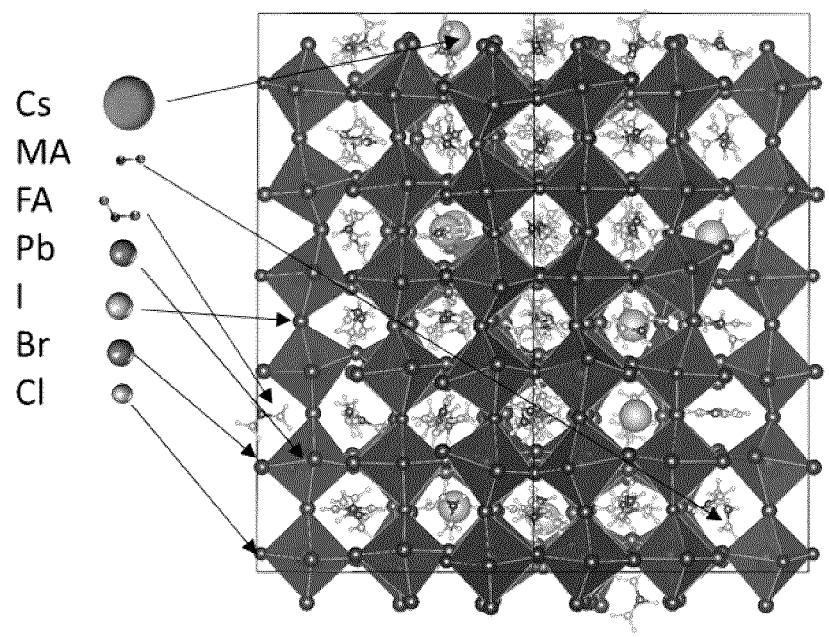

To gain insight into the origins of improved stability of CsMAFA, the inventors calculated formation energies of $FAPbI_3$ and CsMAFA as well as antisites and Schottky vacancies (stoichiometric amount of anion and cation vacancies) for large supercells, consisting of 108 $ABX_3$ primitive cells (FIG. 2a), using density functional theory (DFT). The inventors did not find a notable difference in the formation energies of the compounds, indicating that mixing does not result in a major thermodynamic stabilization of these CsMAFA compositions against disproportionation into precursors (Table 3). Similarly, the formation of Pb—I antisites, the most probable deep electronic traps, are equally unlikely in the FA-rich materials given their high formation energies (FIG. 2b).

Figure 2B:
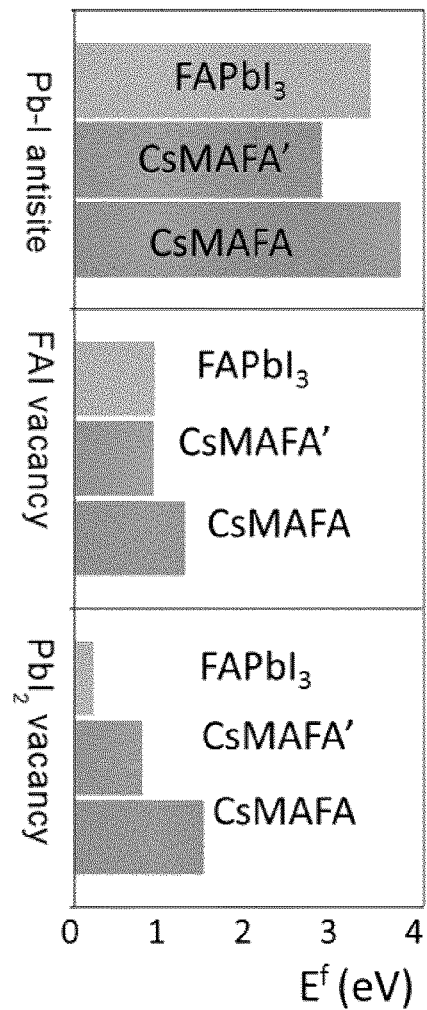

In contrast, the inventors found a significant difference in the formation energies associated with lead iodide vacancies (FIG. 2b). In $FAPbI_3$, this energy is remarkably low (~0.25 eV), corresponding to an equilibrium $PbI_2$ vacancy density of ~3×10$^{17}$ cm$^{-3}$ (Table 4). When FA and I are partially replaced with Cs/MA and Br, respectively, the $PbI_2$ vacancy formation energy is increased more than threefold, corresponding to reducing vacancy concentration by an estimated factor of $10^9$.

Figure 3A:
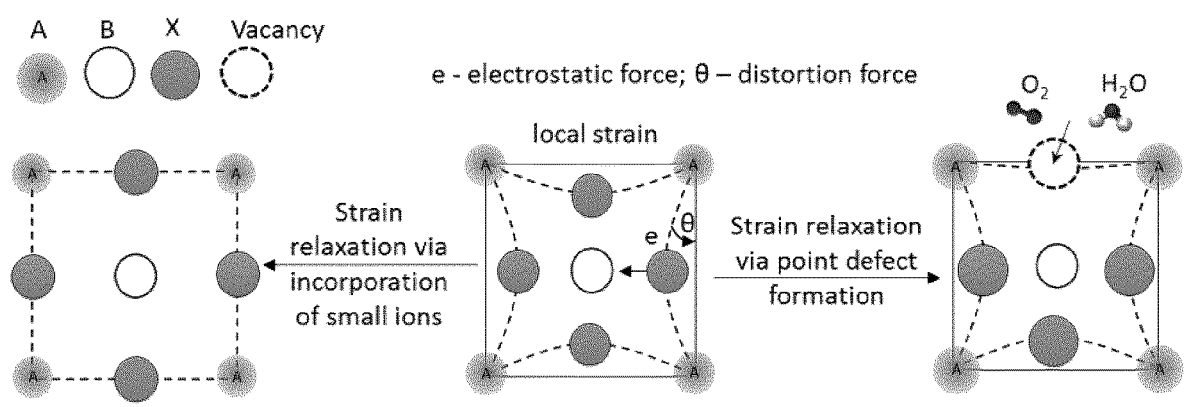
Figure 7A:
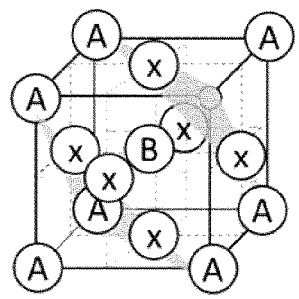
Figure 7B:
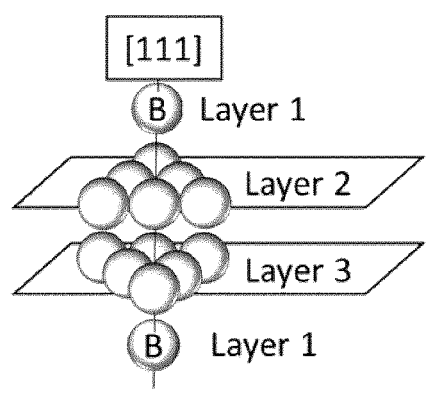
Figure 7C:
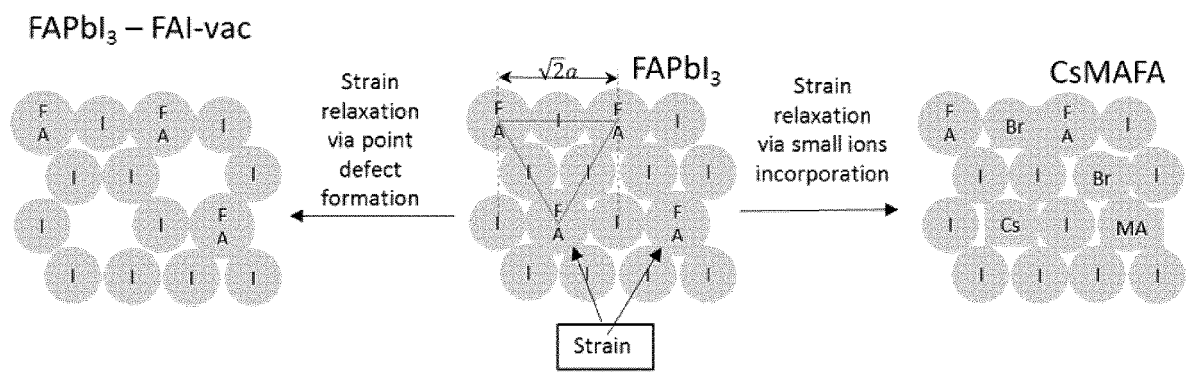
Figure 8A:
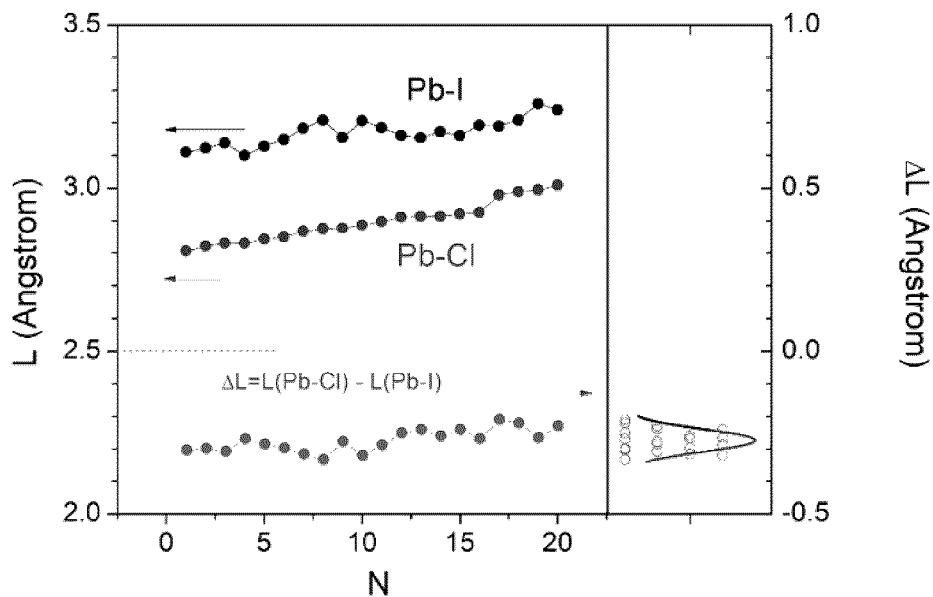
Figure 8B:
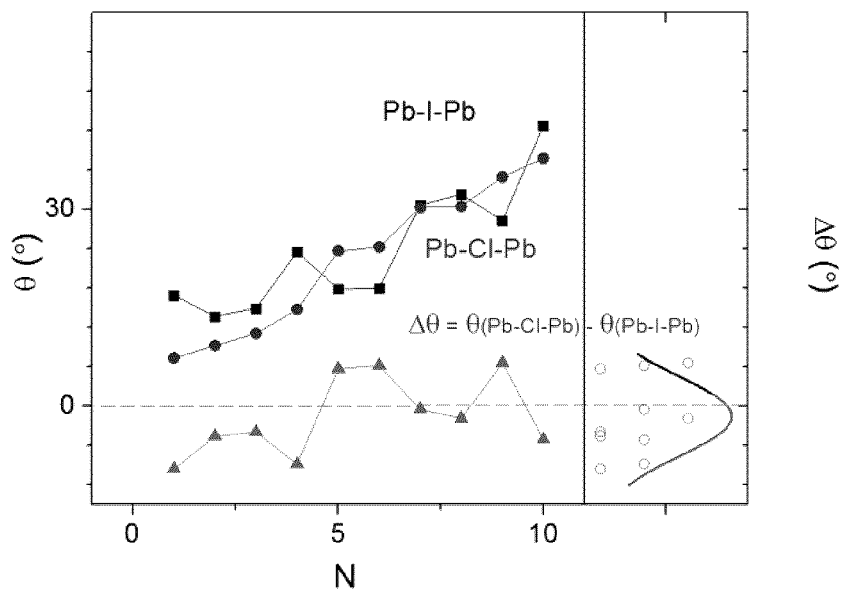
Figure 8C:
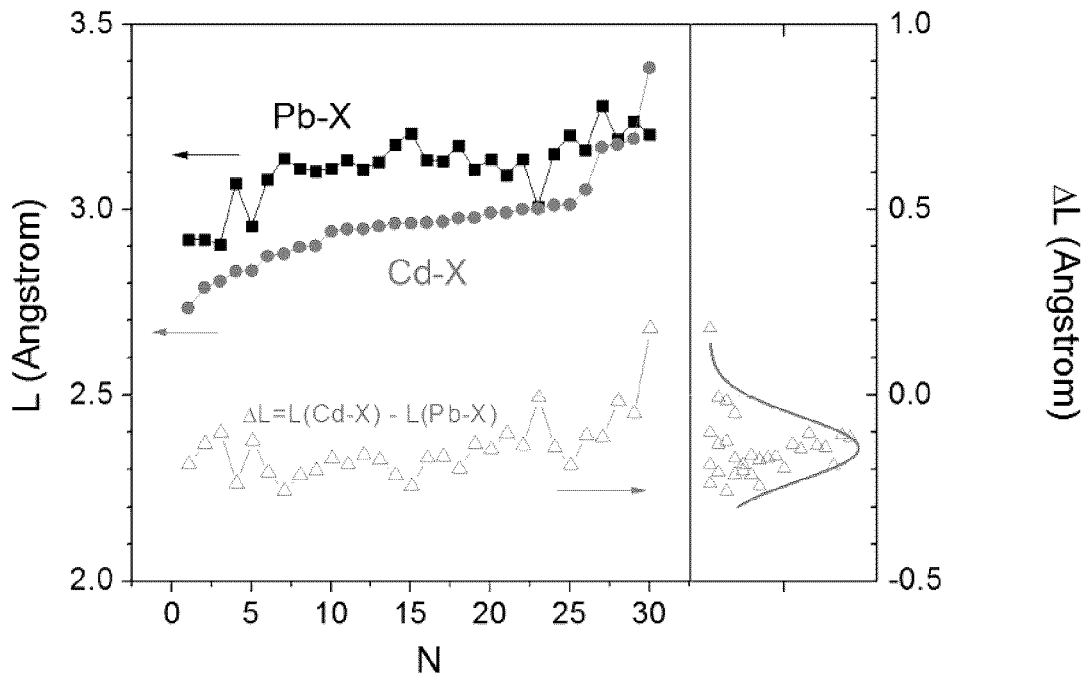
Figure 8D:
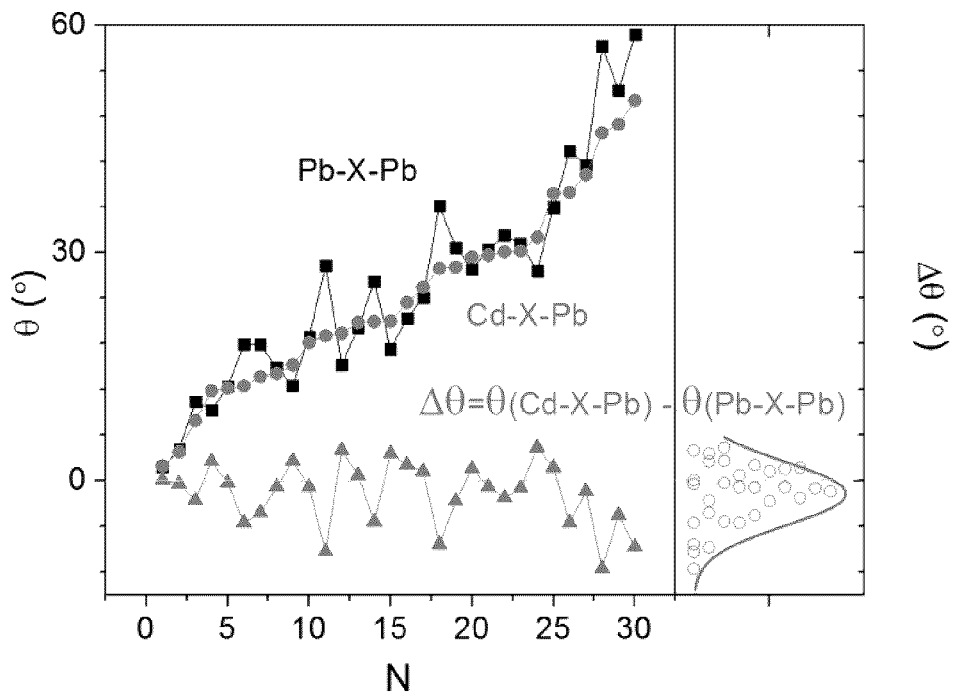

The inventors account for this through the pathways of lattice strain relaxation depicted in FIG. 3a. Strain originates from the ionic size mismatch between the A cation and the lead halide cage size resulting in cage distortions and $BX_6$ octahedra tilting (FIG. 3a, middle panel). The strain in $FAPbI_3$ is reduced by point defect formation in $FAPbI_3$ (FIG. 3a, right panel and FIG. 7): this mechanism of lattice relaxation via vacancy formation has been observed in oxide perovskites[9].

Figure 3B:
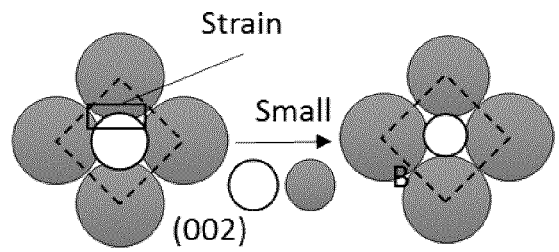

To elucidate further the role of lattice strain relaxation on the formation of vacancies, the inventors expanded the cage by 2% (this decreases the Pb—I—Pb distortion angles, a result also achieved by the incorporation of small ions, FIG. 8) in $FAPbI_3$ and found that $PbI_2$ vacancy formation energy increases by 0.55 eV. This suggests that incorporation of small ions prevents formation of defects by opening a new lattice strain relaxation pathway in CsMAFA (FIG. 3, left panel), which is otherwise reached by vacancy formation in single cation/anion perovskites.

Vacancies in Perovskite Decomposition and Strategies for their Suppression

Although perovskite vacancies are shallow electronic traps, they hold potential to cause the formation of deep traps if they react with the ambient environment and assist in perovskite decomposition via the vacancy-assisted decomposition mechanism (FIG. 3a). In single cation/anion perovskites, the lattice strain is thermodynamically relaxed via formation of vacancies, which are then attacked by water and oxygen molecules: the absorption of water and oxygen molecules at the vacancy sites is significantly more favorable than at pristine surfaces[10]. However, the density of vacancies in CsMAFA perovskites is reduced by orders of magnitude due to the lattice strain relaxation via small ions incorporation, thereby significantly suppressing decomposition of CsMAFA-based devices.

Figure 4A:
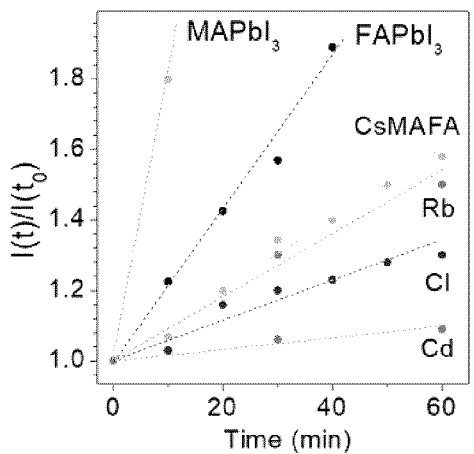
Figure 9A:
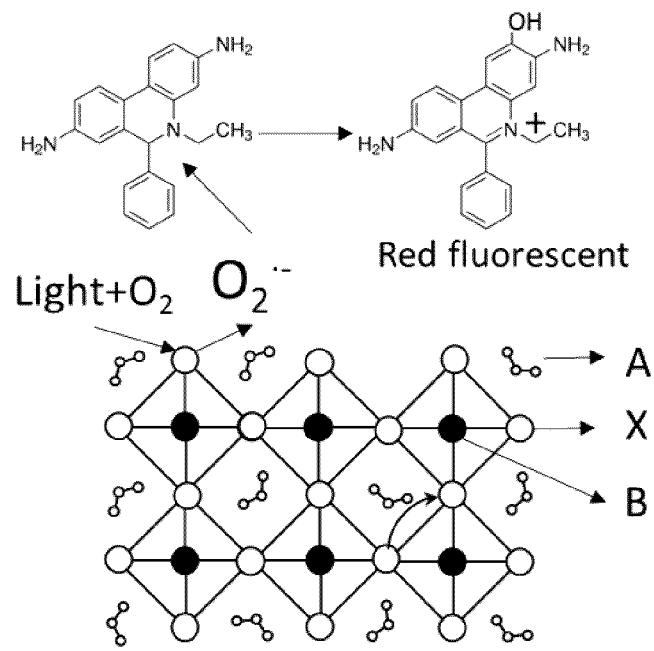
Figure 9B:
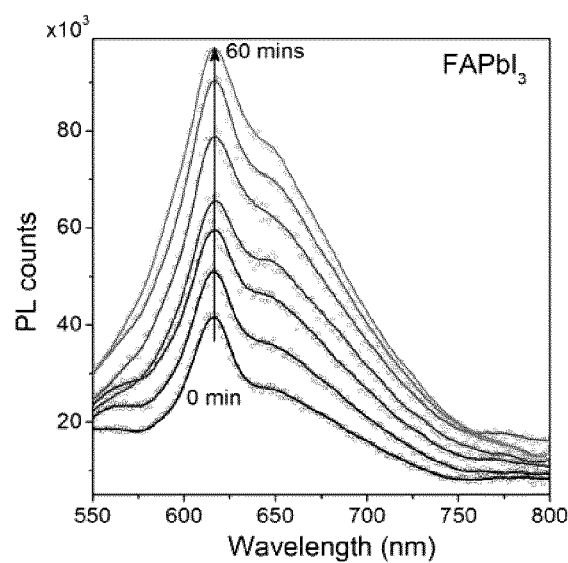

The inventors explored experimentally the results of our computational studies by measuring the rate of superoxide generation mediated by vacancies in perovskites: the inventors found the superoxide yield to be significantly reduced in CsMAFA films compared to $MAPbI_3$ and $FAPbI_3$ films (FIG. 4a). The superoxide generation rate was measured using a hydroethidine fluorescent probe as described in FIG. 9 and detailed in previous studies.[10]

The vacancy-assisted mechanism of perovskite decomposition suggests a means to increase further the stability of perovskites in air ambient. Our concept is to relax the remaining lattice strain on B/X sites (FIG. 3b) to maximize further the formation energy of the most abundant defect without introducing electronic traps. The inventors therefore chose isovalent dopants as candidates (FIG. 3c, Table 5), noting that heterovalent dopants may introduce more defects. The inventors show that soft Lewis acids are promising candidates for this purpose since the I⁻ counter-ion is a soft base, while hard Lewis acids deteriorate the performance of solar cells. This agrees with the Pearson hard and soft acid and base (HSAB) concept: soft acids form stronger bonds with soft bases, while hard acids form stronger bonds with hard bases.

Incorporation of Cl to Reduce the Density of Vacancies and Improve the Stability The inventors start with incorporation of Cl⁻ as a promising test case for this purpose, as it is isoelectronic with I⁻ and may further decrease the lattice strain due to its small ionic radius. Previous reports found that Cl blended into $MAPbI_3$ solution enhances carrier transport in the ultimate perovskite film,[11] whose composition was initially thought to be $MAPbI_2Cl$, as in the precursor solution. Recent studies established that there is no Cl in the final crystal lattice and that Cl may only reside at the interface, thus its role was attributed to the morphological evolution of $MAPbI_3$[12]. Here the inventors explore instead Cl incorporation within the CsMAFA lattice with the goal of preventing the formation of vacancies, identifying a new role for Cl that enables air-ambient-tolerant perovskites.

The inventors first carried out DFT calculations to investigate the role of Cl in relaxing the lattice strain and reducing the vacancy density. The inventors found that when I was partially replaced by Cl, the Pb—X bond lengths decreased, as did the Pb—X—Pb distortion angles (FIG. 8). The inventors then created I-vacancy in CsMAFA in the most energetically favorable position in the lattice and replaced ions (I with Cl) in various nearby sites (FIG. 10). The inventors found that, for all configurations, the I-vacancy formation is suppressed by ≥0.3 eV in the presence of Cl. The inventors note that formation of a charged defect favors the formation of a counter-charged defect in perovskites, which subsequently form charge-neutral Schottky defect pairs (FIG. 11).

Cl-containing CsMAFA films were fabricated using $PbCl_2$ as a Cl source mixed in solution (see Methods for the details). The reduced superoxide generation indicates that Cl suppresses the density of defects (FIG. 4a). In particular, in air ambient with RH of 50%, CsMAFA films degraded within fewer than 7 days, while the films with Cl remained dark (FIG. 12). The stability of perovskite films to thermal stress (85° C.) in air ambient were tested by monitoring their absorption spectra (FIG. 13). The change in absorption represents the change in the effective thickness of perovskite. The inventors observed a 2× lower rate of absorption change for Cl-containing CsMAFA films, indicating their improved stability over control CsMAFA films.

To ascertain whether Cl is incorporated within the crystal structure, single crystals were grown in the presence of Cl, and performed XPS of the cleaved interior of the crystal. The results showed the successful incorporation of Cl within CsMAFA perovskite (FIG. 14). Thus, in contrast with $MAPbI_3$, CsMAFA is able to host Cl: the inventors explain this by noting that the ~⅙ occupancy of CsMAFA halide-site with Br (Br-based perovskites can form solid solutions with both I and Cl)[13] and the presence of Cs ($CsPbI_3$ can host Cl at levels near the solubility of Cl in $CsPbI_3$)[14].

Incorporation of Cd

Figure 3C:
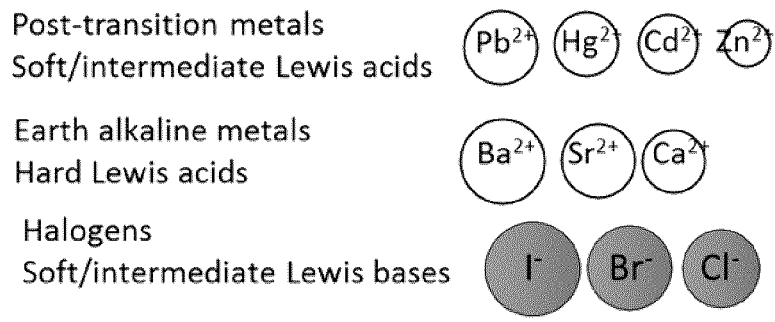

The mechanism of lattice strain relaxation via the incorporation of small monovalent halogen anions (Cl) suppressed the formation of vacancies and, consequently, enhanced stability. However, incorporation of additional Cl will increase the bandgap, undesirable for solar cells (FIG. 15). The inventors therefore expanded our concept of lattice strain relaxation to include B-site dopants (FIG. 3c). The inventors chose Cd, which is isovalent to Pb but has a smaller ionic radius (Table 5), the prerequisites for further strain relaxation without introducing traps.

DFT calculations showed that Cd incorporation indeed relaxes the lattice strain (FIG. 8) and suppresses the formation energy of I-vacancy by ≥0.5 eV (FIG. 10), i.e. to an appreciably greater extent than does Cl incorporation.

The inventors measured a significantly further-reduced rate of superoxide generation in the films with Cd (FIG. 4a). The inventors also observed successful incorporation of Cd within the perovskite crystal lattice (FIG. 14), in agreement with previous findings.[15] The inventors note that Rb-containing CsMAFA showed no reduction in the rate of superoxide generation (FIG. 4a). This may arise due to a failure of Rb to incorporate within the crystal lattice.

Figure 4B:
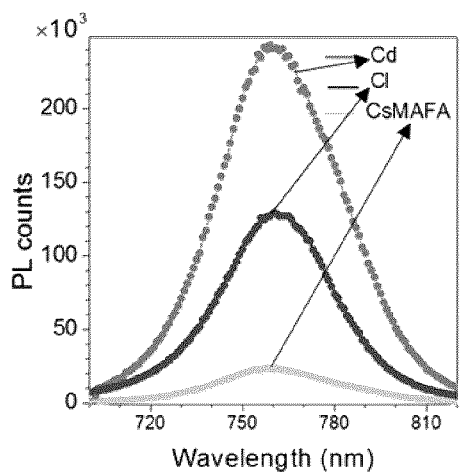
Figure 4C:
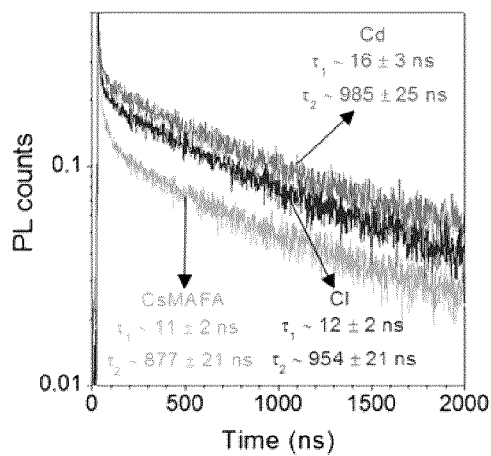
Figure 4D:
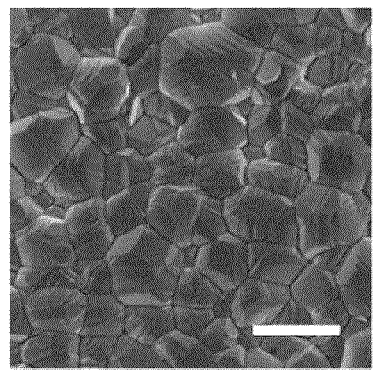
Figure 4E:
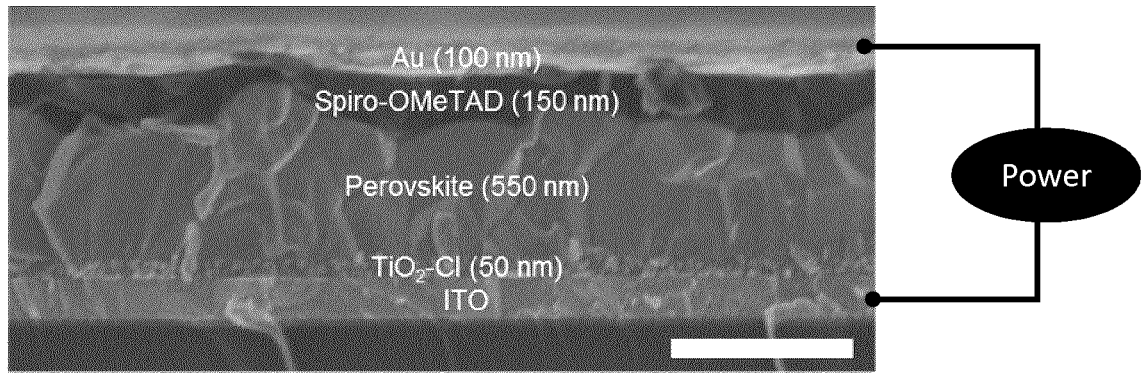

Incorporation of Cl and Cd increased the PL intensity of films five- and ten-fold, respectively. (FIG. 4b). PL lifetime measurements revealed that Cl and Cd incorporation decreases twofold the integrated contribution of the short recombination term and notably increases the integrated counts of the long recombination term (FIG. 4c, FIG. 16). Identical XRD diffraction patterns and SEM images (FIG. 4d,e, FIG. 17) indicate that the lattice parameters and morphology are preserved at the Cl and Cd concentrations used herein.

Perovskite Solar Cell Performance and Stability

With the goal of improving stability in Cl and Cd films, the inventors sought to quantify the impact of Cl and Cd integration on PSC devices. The inventors fabricated PSCs in planar architecture following the recently reported CsMAFA PSCs on Cl-capped $TiO_2$ with 20.1% certified PCE. The latter also served as a control device.

Figure 5A:
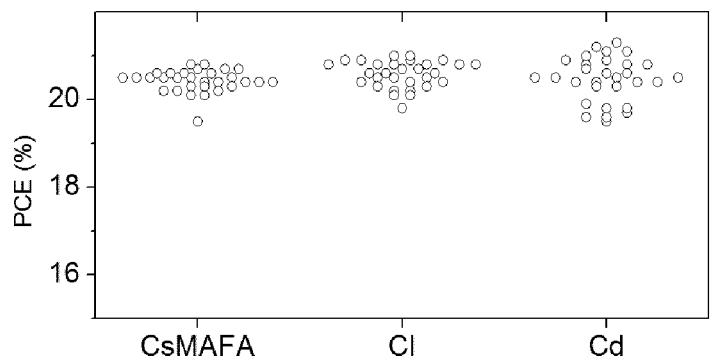

Freshly fabricated CsMAFA, Cl— and Cd-PSCs showed similar average PCEs of ~20.5%, $V_{oc}$ of 1.16 V, FF of ~80% and $J_{sc}$ of ~22 mA/cm² (FIG. 5a, FIGS. 18 and 24): the latter agrees with the external quantum yield (EQE) measurements (FIG. 19).

Figure 5B:
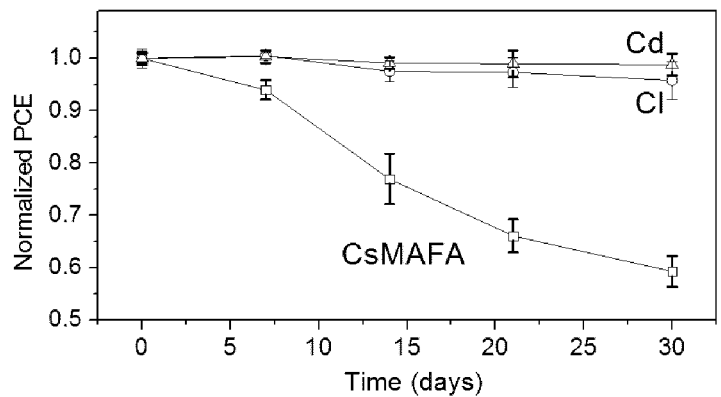

The devices showed a large difference in stability when stored in air ambient at RH of 50% (FIG. 5b). Unencapsulated Cl- and Cd-PSCs retained >95% of their initial PCE after storage in the dark in air ambient for 30 days. In contrast, CsMAFA PSCs retained only 60% of their initial PCE and exhibited bleaching (FIG. 5b).

Figure 5C:
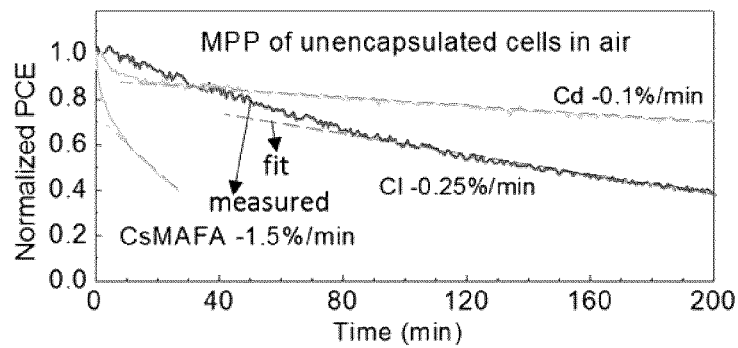
Figure 5D:
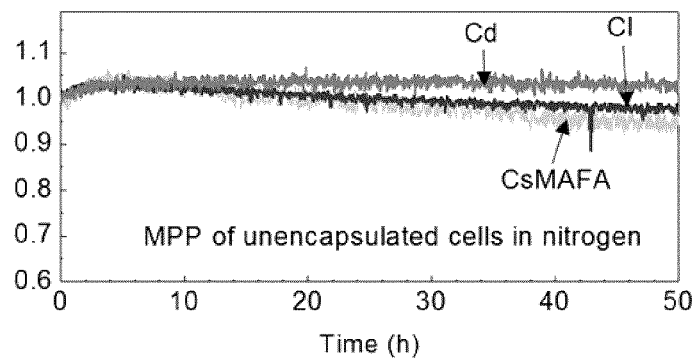

The inventors also investigated the photostability of unencapsulated PSCs under MPP operation and continuous illumination in air ambient. CsMAFA cells showed a rapid loss of PCE with relative −1.5%/min of linear slope, while Cl and Cd cells extended the lifetime by a factor of 6 and 15, respectively (FIG. 5c, FIG. 20). Extended stability of Cd-containing PSCs agrees with our computational results as well as our experimental measurements of superoxide generation rate. In a nitrogen atmosphere, all PSCs retained >90% of their initial PCE after continuous MPP for tens of hours (FIG. 5d), indicating that the moisture and oxygen in air play a vital role in their decomposition.

Defects in perovskites assist segregation of halides under illumination, leading to hysteresis. In agreement with the finding herein, the inventors found large hysteresis in $MAPbI_3$ and $FAPbI_3$-based PSCs, whereas hysteresis for mixed PSCs was negligible (Table 6). The CsMAFA treatment with MACl and vinyl benzyl chloride (VBCl) also enhanced PL peaks as a result of surface passivation (FIG. 21); however, devices showed poor performance and large hysteresis (Table 6, FIG. 22). The inventors attribute this to off-stoichiometric surface composition after treatment. Engineering of defects in the bulk and at the surface is likely crucial to the combination of performance and stability in PSCs.

In light of the proposed vacancy engineering mechanisms, the inventors also explored the effect of other divalent dopants such as hard Lewis acids (Group 2: Ba, Ca, Sr) and soft Lewis acids (Group 12: Hg and Zn) on the performance of PSCs (FIG. 23). Hard Lewis acids showed a notably decreased time-zero PCE, likely due to a lack of incorporation and formation of traps: this agrees with HSAB theory whereby soft $I^-$ base forms a stronger bond with soft acid $Pb^{2+}$. Zn-doped PSCs showed promising stability; however, the time-zero PCE of devices was slightly decreased, a subject for future studies. Hg-containing PSCs exhibited an opposite trend: comparable initial PCE, but substantial degradation within few days, likely due to formation of heterovalent $Hg^+$ that introduces more vacancies. These findings agree with our DFT findings (FIG. 10), that Zn suppresses formation of vacancies, while Hg is a vacancy-formation promoter.

Because the standard photovoltaic encapsulation materials transmit water and oxygen at a rate sufficient for complete degradation of perovskites within few days (Table 1), it is desirable to realize PSCs that exhibit enhanced operating stability in air ambient to ensure that realistic encapsulation technologies can be used. Mixed CsMAFA perovskite is less prone to form vacancies compared to single cation/anion perovskites, and therefore is more stable against decomposition. Suppressing atomic vacancies via incorporation of Cd and Cl within the CsMAFA lattice further enhances the air ambient MPP operational stability of state-of-art PSCs for an order of magnitude. This in turn significantly relaxes the requirements for encapsulation materials and their processing conditions. The proposed degradation mechanism and vacancy engineering strategy via lattice strain relaxation open a new avenue to enable continued progress toward PSCs with 25-year operating lifetime with practical encapsulants.

TABLE 1

Water vapor transmission rate (WVTR) and oxygen transmission rate (OTR) of encapsulation materials used in silicon and thin film solar cells encapsulation practices.

| Material | WVTR, g/m²/day | OTR, cm³/m²/day | Where it is used |
| --- | --- | --- | --- |
| Ethyl vinyl acetate (EVA) | 27-33 | | |
| Poly(ethyline terephtalate) | 0.05-2.3 | | |
| Ionomer PV5400 (Surlyn) | 0.66 | | Manufacturing silicon cells |
| UV-curable polymer (NOA63) | 0.031 | | In-lab encapsulations |
| SiO$_x$/SiN$_x$ - Plasma enhanced chemical vapor deposition | 0.01 | 0.1 | In-lab encapsulations of organic LEDs |
| Al$_2$O$_3$/ZrO$_2$ - atomic layer deposition | 4.7 × 10$^{-5}$ | 1.6 × 10$^{-2}$ | Reported, not commercialized |
| Flexible encapsulation materials (polyethylene, polypropylene, polystyrene, polyimide) | 0.4-40 | 0.04-540 | Flexible electronics |

Conventional encapsulation materials transmit 0.05 g of water in a day, which is enough to destroy the perovskite film. A number of studies showed that oxygen is as harsh as water is for perovskites under illumination. Encapsulation materials normally have even higher values of OTR than that of WVTR. Thus, currently used encapsulation materials are inadequate for PSCs.

TABLE 2

Elemental composition in the feed solution and in the grown CsMAFA (Cs$_{0.05}$MA$_{0.15}$FA$_{0.8}$PbI$_{2.55}$Br$_{0.45}$) crystals, estimated by XPS and $^1$HNMR.

| | Pb | Cs | Br | I | FA/MA |
| --- | --- | --- | --- | --- | --- |
| In the feed solution | 1 | 0.05 | 0.55 | 2.45 | 0.8/0.15 |
| XPS | 1 | 0.05 ± 0.02 | 0.66 ± 0.1 | 3.0 ± 0.7 | — |
| $^1$HNMR | | | | | 0.8/0.13 |

TABLE 3

The composition of compounds used in DFT calculations.

| Abbreviation | Composition | Formation energy relative to FAPbI$_3$ (eV) |
| --- | --- | --- |
| FAPbI$_3$ | FA$_{108}$Pb$_{108}$I$_{324}$ | 0 |
| CsMAFA' | Cs$_2$MA$_{12}$FA$_{94}$Pb$_{108}$Br$_{55}$I$_{269}$ | −0.041 |
| CsMAFA | Cs$_8$MA$_{12}$FA$_{88}$Pb$_{108}$Br$_{55}$I$_{269}$ | −0.010 |
| Cl | Cs$_8$MA$_{12}$FA$_{88}$Pb$_{108}$Cl$_{10}$Br$_{55}$I$_{259}$ | −0.014 |

Formation energy of FAPbI$_3$ was 0.10 eV and 0.39 eV using DFT-D3 and DFT-D2 van-der-Waals interactions, respectively. These positive values are consistent with experimental observations, that black phase is thermodynamically unstable compared to yellow phase of FAPbI$_3$.

TABLE 4

Comparison of vacancy formation energies and vacancy densities in MAPbI$_3$ and FAPbI$_3$.

| | MAPbI$_3$ - ref.[16] | FAPbI$_3$ - this work |
| --- | --- | --- |
| MAI/FAI vacancy formation energy | 0.08 | 0.96 |
| PbI$_2$ vacancy formation energy | 0.22 | 0.25 |
| MAI/FAI vacancy density (cm$^{-3}$) | 2 × 10$^{20}$ | 2 × 10$^5$ |
| PbI$_2$ vacancy density (cm$^{-3}$) | 8 × 10$^{17}$ | 3 × 10$^{17}$ |

The defect chemistry of FAPbI$_3$ is substantially different compared to that of MAPbI$_3$. MAPbI$_3$ has a high density of MAI vacancies (~10$^{20}$ cm$^{-3}$) due to the low formation energy of MAI vacancies. In contrast, in FAPbI$_3$ the formation energy of FAI vacancies is remarkably higher than that of PbI$_2$, indicating that PbI$_2$ vacancies are preferred. In addition, FAPbI$_3$ is less prone to formation of point defects than MAPbI$_3$ is, accounting for commonly observed improved stability of FAPbI$_3$-based perovskites against decomposition.

TABLE 5

Ionic radii and electronic configuration of elements.

| Cation | r, pm | Electronic configuration |
| --- | --- | --- |
| Pb$^{2+}$ | 119 | [Xe] 6s$^2$ 4f$^{14}$ 5d$^{10}$ |
| Hg$^{2+}$ | 102 | [Xe] 4f$^{14}$ 5d$^{10}$ |
| Cd$^{2+}$ | 95 | [Kr] 4d$^{10}$ |
| Zn$^{2+}$ | 74 | [Ar] 3d$^{10}$ |
| Ba$^{2+}$ | 135 | [Xe] |
| Sr$^{2+}$ | 118 | [Kr] |
| Ca$^{2+}$ | 100 | [Ar] |

TABLE 5-continued

Ionic radii and electronic configuration of elements.

| Anion | r, pm | Electronic configuration |
|---|---|---|
| I$^-$ | 220 | [Xe] |
| Br$^-$ | 196 | [Kr] |
| Cl$^-$ | 181 | [Ar] |

TABLE 6

Hysteresis of fresh and aged PSCs based on different perovskite layers and passivation methods.

| Absorber | Scan direction | V$_{oc}$ (V) | J$_{sc}$ (mA/cm$^2$) | FF (%) | PCE (%) | HI* (%) Fresh/ 30 days |
|---|---|---|---|---|---|---|
| MAPbI$_3$** | Reverse | 1.09 | 21.1 | 80.1 | 18.5 | 42/53 |
| | Forward | 1.02 | 20.7 | 50.3 | 10.7 | |
| FAPbI$_3$ | Reverse | 1.04 | 21.8 | 64.6 | 14.6 | 3/19 |
| | Forward | 1.04 | 22.1 | 61.3 | 14.1 | |
| CsMAFA | Reverse | 1.11 | 21.9 | 78.0 | 19.0 | <1/8 |
| | Forward | 1.12 | 22.1 | 75.6 | 18.8 | |
| CsMAFA-Cl | Reverse | 1.14 | 21.8 | 77.2 | 19.2 | <1/1 |
| | Forward | 1.14 | 22.3 | 74.8 | 19.1 | |
| CsMAFA-MACl (surface passivation) | Reverse | 1.06 | 22.1 | 78.7 | 18.7 | 18/22 |
| | Forward | 1.04 | 21.8 | 67.6 | 15.3 | |
| CsMAFA-VBCl (surface passivation) | Reverse | 0.98 | 10.7 | 32.5 | 3.4 | — |
| | Forward | 1.02 | 10.7 | 30.4 | 3.3 | |

Hysteresis index is defined as $HI = \frac{PCE_{reverse} - PCE_{forward}}{PCE_{reverse}} \times 100\%$

**MAPbI$_3$ was deposited from 1.4M DMSO/GBL (1/1) solution.

REFERENCES

1. Eperon, G. E. et al. Formamidinium lead trihalide: a broadly tunable perovskite for efficient planar heterojunction solar cells. *Energy Environ. Sci.* 7, 982 (2014).
2. Li, Z. et al. Stabilizing Perovskite Structures by Tuning Tolerance Factor: Formation of Formamidinium and Cesium Lead Iodide Solid-State Alloys. *Chem. Mater.* 28, 284-292 (2016).
3. Jeon, N. J. et al. Compositional engineering of perovskite materials for high-performance solar cells. *Nature* 517, 476-480 (2015).
4. Saliba, M. et al. Cesium-containing triple cation perovskite solar cells: improved stability, reproducibility and high efficiency. *Energy Environ.* 9, 1989-1997 (2016).
5. Saliba, M. et al. Incorporation of rubidium cations into perovskite solar cells improves photovoltaic performance. *Science* 354, 206-209 (2016).
6. Syzgantseva, O. A., Saliba, M., Gratzel, M. & Rothlisberger, U. Stabilization of the Perovskite Phase of Formamidinium Lead Triiodide by Methylammonium, Cs, and/or Rb Doping. *J. Phys. Chem. Lett.* 8, 1191-1196 (2017).
7. Yi, C. et al. Entropic stabilization of mixed A-cation ABX 3 metal halide perovskites for high performance perovskite solar cells. *Energy Environ. Sci.* 9, 656-662 (2016).
8. Saidaminov, M. I. et al. High-quality bulk hybrid perovskite single crystals within minutes by inverse temperature crystallization. *Nat. Commun.* 6, 7586 (2015).
9. Aschauer, U., Pfenninger, R., Selbach, S. M., Grande, T. & Spaldin, N. A. Strain-controlled oxygen vacancy formation and ordering in CaMnO3. *Phys. Rev. B* 88, 54111 (2013).
10. Aristidou, N. et al. Fast oxygen diffusion and iodide defects mediate oxygen-induced degradation of perovskite solar cells. *Nat. Commun.* 8, 15218 (2017).
11. Stranks, S. D. et al. Electron-Hole Diffusion Lengths Exceeding 1 Micrometer in an Organometal Trihalide Perovskite Absorber. *Science* 342, 341-344 (2013).
12. Starr, D. E. et al. Direct observation of an inhomogeneous chlorine distribution in CH 3 NH 3 PbI 3Åx ClxIayers: surface depletion and interface enrichment. *Energy Environ. Sci.* 8, 1609-1615 (2015).
13. Noh, J. H., Im, S. H., Heo, J. H., Mandal, T. N. & Seok, S. II. Chemical management for colorful, efficient, and stable inorganic-organic hybrid nanostructured solar cells. *Nano Lett.* 13, 1764-1769 (2013).
14. Dastidar, S. et al. High Chloride Doping Levels Stabilize the Perovskite Phase of Cesium Lead Iodide. *Nano Lett.* 16, 3563-3570 (2016).
15. Dunlap-Shohl, W. A., Younts, R., Gautam, B., Gundogdu, K. & Mitzi, D. B. Effects of Cd Diffusion and Doping in High-Performance Perovskite Solar Cells Using CdS as Electron Transport Layer. *J. Phys. Chem. C* 120, 16437-16445 (2016).
16. Walsh, A., Scanlon, D. O., Chen, S., Gong, X. G. & Wei, S.-H. Self-Regulation Mechanism for Charged Point Defects in Hybrid Halide Perovskites. *Angew. Chemie Int. Ed.* 54, 1791-1794 (2015).

Therefore what is claimed is:

1. A perovskite compound having a formula ABX$_3$,
   wherein A comprises two or more of formamidinium (FA), cesium (Cs), methylammonium (MA), guanidinium (GA), dymethylammonium (DMA), and ethylammonium (EA);
   wherein B comprises lead (Pb) and cadmium (Cd), the cadmium uniformly distributed throughout a bulk of the perovskite compound; and
   wherein X comprises bromide (Br) and at least one of iodide (I) and chloride (CI), wherein the perovskite compound is a bulk perovskite compound.

2. The perovskite compound according to claim 1 wherein B further comprises zinc (Zn).

3. A solar cell, comprising:
   a substrate, a first electronically conductive layer on a top surface of said substrate;
   a layer of an electron transport layer located on a top surface of the electronically conductive layer;
   a layer of perovskite compound according to claim 2 on a top surface of said electron transport layer;
   a hole transport layer located on a top surface of said layer of a perovskite compound;
   a second electrically conductive layer located on a top surface of said hole transport layer; and
   said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

4. The solar cell according to claim 3 wherein said layer of perovskite compound has a thickness in a range from about 50 nm to about 100 microns.

5. The perovskite compound according to claim 1, wherein B further comprises tin (Sn).

6. A solar cell, comprising:
   a substrate, a first electronically conductive layer on a top surface of said substrate;

a layer of an electron transport layer located on a top surface of the electronically conductive layer;
a layer of perovskite compound according to claim 5 on a top surface of said electron transport layer;
a hole transport layer located on a top surface of said layer of a perovskite compound;
a second electrically conductive layer located on a top surface of said hole transport layer; and
said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

7. The solar cell according to claim 6 wherein said layer of perovskite compound has a thickness in a range from about 50 nm to about 100 microns.

8. The perovskite compound according to claim 1, wherein B further comprises tin (Sn) and zinc (Zn).

9. A solar cell, comprising:
a substrate, a first electronically conductive layer on a top surface of said substrate;
a layer of an electron transport layer located on a top surface of the electronically conductive layer;
a layer of perovskite compound according to claim 8 on a top surface of said electron transport layer;
a hole transport layer located on a top surface of said layer of a perovskite compound;
a second electrically conductive layer located on a top surface of said hole transport layer; and
said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

10. The solar cell according to claim 9 wherein said layer of perovskite compound has a thickness in a range from about 50 nm to about 100 microns.

11. A solar cell, comprising:
a substrate, a first electronically conductive layer on a top surface of said substrate;
a layer of an electron transport layer located on a top surface of the electronically conductive layer;
a layer of perovskite compound according to claim 4 on a top surface of said electron transport layer;
a hole transport layer located on a top surface of said layer of a perovskite compound;
a second electrically conductive layer located on a top surface of said hole transport layer; and
said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

12. The solar cell according to claim 11 wherein said layer of perovskite compound has a thickness in a range from about 50 nm to about 100 microns.

13. The perovskite compound according to claim 1 wherein B further comprises any one or more of manganese (Mn), iron (Fe), cobalt (Co), nickel (Ni), copper (Cu) and germanium (Ge).

14. The perovskite compound according to claim 1, wherein A comprises a mixture of formamidinium (FA), cesium (Cs) and methylammonium (MA).

15. A solar cell, comprising:
a substrate, a first electronically conductive layer on a top surface of said substrate;
a layer of an electron transport layer located on a top surface of the electronically conductive layer;
a layer of a perovskite compound according to claim 14 on a top surface of said electron transport layer;
a hole transport layer located on a top surface of said layer of a perovskite compound;
a second electrically conductive layer located on a top surface of said hole transport layer; and
said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

16. The solar cell according to claim 15 wherein said layer of perovskite compound has a thickness in a range from about 50 nm to about 100 microns.

17. The perovskite compound according to claim 14, wherein A is $Cs_xMA_yFA_{1-x-y}$, wherein x is in a range from $0<x<1$, wherein y is in a range from $0<y<1$, and wherein $x+y<1$, wherein B is $Pb_iCd_{1-i}$, wherein i is in a range from $0<i<1$, and when iodide is present, X is $I_mBr_{3-m}$, wherein m is in a range from $0<m<3$, and wherein
when only chloride is present, X is $Br_nCl_{3-n}$, wherein n is in a range from $0<n<3$, and wherein when both I and Cl are present, X is $I_kBr_hCl_{3-h-k}$, wherein k is in a range from $0<k<3$, wherein h is in a range from $0<h<3$, and wherein $k+h<3$.

18. A solar cell, comprising:
a substrate, a first electronically conductive layer on a top surface of said substrate;
a layer of an electron transport layer located on a top surface of the electronically conductive layer;
a layer of a perovskite compound according to claim 17 on a top surface of said electron transport layer;
a hole transport layer located on a top surface of said layer of a perovskite compound;
a second electrically conductive layer located on a top surface of said hole transport layer; and
said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

19. The solar cell according to claim 18 wherein said layer of perovskite compound has a thickness in a range from about 50 nm to about 100 microns.

20. The perovskite compound according to claim 14, wherein A is $Cs_{0.05}MA_{0.15}FA_{0.8}$, and B is $Pb_{0.97}Cd_{0.03}$, and wherein X is $I_{2.55}Br_{0.45}$.

21. A solar cell, comprising:
a substrate, a first electronically conductive layer on a top surface of said substrate;
a layer of an electron transport layer located on a top surface of the electronically conductive layer;
a layer of a perovskite compound according to claim 20 on a top surface of said electron transport layer;

a hole transport layer located on a top surface of said layer of a perovskite compound;

a second electrically conductive layer located on a top surface of said hole transport layer; and said first and second electronically conductive layers having electrically conductive electrodes attached thereto at one end thereof and the other ends of said electrically conductive electrodes being attached to a load such that when light of wavelengths greater than a band gap of said perovskite compound impinge on said solar cell, electrical current is produced.

22. The solar cell according to claim 21 wherein said layer of perovskite compound has a thickness in a range from about 50 nm to about 100 microns.

23. The perovskite compound according to claim 1, wherein one of the constituents of A is Cs.

\* \* \* \* \*